United States Patent [19]

Hiroshi et al.

[11] Patent Number: 5,377,138
[45] Date of Patent: Dec. 27, 1994

[54] SEMICONDUCTOR MEMORY AND DATA PROCESSING DEVICE

[75] Inventors: Kayamoto Hiroshi; Masahiko Nakajima, both of Suwa, Japan

[73] Assignee: Seiko Epson Corporation, Tokyo, Japan

[21] Appl. No.: 645,504

[22] Filed: Jan. 24, 1991

[30] Foreign Application Priority Data

| Jan. 24, 1990 | [JP] | Japan | 2-14102 |
| Jan. 24, 1990 | [JP] | Japan | 2-14103 |
| Jan. 26, 1990 | [JP] | Japan | 2-17041 |
| Jan. 26, 1990 | [JP] | Japan | 2-17042 |
| May 23, 1990 | [JP] | Japan | 2-133226 |
| Jun. 18, 1990 | [JP] | Japan | 2-159414 |
| Jan. 14, 1991 | [JP] | Japan | 3-002406 |

[51] Int. Cl.$^5$ ................................ G11C 7/00
[52] U.S. Cl. .................... 365/154; 365/189.01; 365/226
[58] Field of Search ......... 365/154, 226, 227, 189.01, 365/218

[56] References Cited

U.S. PATENT DOCUMENTS

| 4,536,859 | 8/1985 | Kamuro | 365/154 |
| 4,692,904 | 9/1987 | Sato et al. | 365/226 |
| 4,751,683 | 6/1988 | Wada et al. | 365/230 |
| 4,901,284 | 2/1990 | Ochii et al. | 365/226 |
| 4,972,375 | 11/1990 | Ueno et al. | 365/226 |
| 5,047,979 | 9/1991 | Leung | 365/154 |

FOREIGN PATENT DOCUMENTS

| 0090632 | 3/1983 | European Pat. Off. |
| 0172587 | 10/1982 | Japan | 365/226 |
| 2028046 | 7/1979 | United Kingdom |

Primary Examiner—Eugene R. LaRoche
Assistant Examiner—Son Dinh
Attorney, Agent, or Firm—Spensley Horn Jubas & Lubitz

[57] ABSTRACT

In a peripheral circuit of a static RAM composed of memory cells of polysilicon high resistance type, there is provided a word line potential deviating circuit which sets the potential of a selected word line during writing operation to be the potential Vvol, the value of which is higher than that of a supplied potential Vdd. The word line potential deviating circuit includes a ring-oscillator circuit, a deviation timing signal generating circuit, a step-up gate control signal generating circuit, a step-up potential generating circuit, a word line supplied potential mixing circuit, and a word line potential supply control circuit.

36 Claims, 18 Drawing Sheets

SEMICONDUCTOR MEMORY AND DATA PROCESSING DEVICE

BACKGROUND OF THE INVENTION

1. Field of the Invention

The invention relates to a static type semiconductor memory device and a data processing device, and more particularly to improved peripheral circuits in a static-RAM (SRAM) with memory cells or flip-flop circuits.

2. Related Art Description

A typical high resistance type static-RAM (SRAM) which employs an internal synchronous mechanism is constituted as shown in FIG. 21. The SRAM has memory cell arrays (Blocks 0 to 15) formed, as shown in FIG. 21, by arranging a plurality of polysilicon memory cells of the high resistance type 1 in a matrix, and a peripheral circuit which performs writing and reading operations wherein one or more memory cells are selected and data or information is written into or read from the selected cells.

The peripheral circuit shown in FIGS. 21 and 22 is generally constituted by a chip control circuit 21 which supplies a chip selecting signal $\overline{CS}$, write enable signal. $\overline{WE}$ and output enable signal $\overline{OE}$ to prescribed circuits on a chip on the basis of control signals provided from the outside, an X-decoder and word line buffer circuit 22 for selecting word lines, a Y-decoder 24 for selecting transfer gate circuits 23, a Z-address buffer circuit (block signal generator) 25 which generates a block signal BLOCK for selecting one or more of Blocks 0 to 15, an X-address buffer circuit 26 for sending information to the X-decoder 22, a Y-address buffer circuit 27 for sending information to the Y-decoder 24, address-transition detecting circuits (ATDs) 28, 29 and 30 which detect transition of the address input signals of the X, Y and Z-address buffer circuits and generate pulses, an internal synchronizing, or timing, circuit 31 for generating synchronizing, or timing, signals in order to precharge and equalize bit lines BL, $\overline{BL}$ just before reading out in a manner to utilize basic pulses generated from the ATDs, a data line loading circuit 32 which controls the potentials on the data lines when writing and reading, a sense amplifier circuit 33 for producing amplified outputs SO, $\overline{SO}$ and for detecting small voltages SIN, $\overline{SIN}$ which emerge on the data line through the transfer gate circuit 23 from memory cells when reading, a writing driver circuit 34 which sends data for writing to the bit lines BL, $\overline{BL}$ when writing, a bit line loading circuit 35 which controls loading of the bit lines BL, $\overline{BL}$ when writing and reading and for equalizing the bit lines BL, $\overline{BL}$ so as to have the same potential just before reading, a bit/data line loading control circuit 36 for controlling the bit line loading circuit 35 and data line loading circuit 32, an I/O buffer circuit 37, and a sense amplifier control circuit 38 for generating a sense amplifier control pulse $\phi$sa which drives the sense amplifier circuit 33 dynamically according to a signal supplied from the internal synchronizing circuit 31.

The X-decoder and word line buffer circuit 22 is conventionally constituted as shown in FIG. 23, wherein it comprises a NAND gate having three inputs for receiving buffer outputs R1-R3 or $\overline{R1}$-$\overline{R3}$ from the X-address buffer circuit 26, and a NOR gate having two inputs for receiving an output of the NAND gate and a buffer output $\overline{Ro}$ or Ro from the X-address buffer circuit 26. In circuit 22 a selected word line WL (WL1, WL2 or the like) is set to supply a potential Vdd of high level (hereinafter referred to as "H"). To the word lines WL are connected memory cells 1 as shown in FIG. 24. In the memory cells 1 connected to a selected word line WL, data writing or reading is carried out via the bit lines BL, $\overline{BL}$.

The potential of the selected word line WL is set to be the supplied potential Vdd of high level "H", that is of logically high level, by means of logic circuits forming the X-decoder and word line buffer circuit 22. The following description will be based on a system in which data writing is carried out by setting the bit line BL to be "H" and setting the bit line $\overline{BL}$ to be low level potential, or ground potential (hereinafter referred to as "L").

The potentials at the memory nodes n1, n2 in the memory cell 1 are established as follows. Since the potential of the word line Vw1 is set to be the supplied potential Vdd, the maximum potential of the memory node n1 is defined by the following expression.

$$V1 = Vw1 - Vt1 - Vb = Vdd - Vt1 - Vb \tag{1}$$

Wherein Vdd is a supplied potential, Vt1 is the threshold voltage of n-channel MOS transistors N3, N4 as transfer gates, and Vb is a voltage drop component resulting from backgate effect. The memory nodes n1, n2 in the memory cell 1 are connected to the supplied potential Vdd through the polysilicon high resistances HR1, HR2, respectively. The values of these polysilicon high resistances HR1, HR2 are generally set to be in the range of several hundred giga-ohms to a few tera-ohms in order to limit current flow to the nodes during the waiting period (stationary period). The currents through the resistances HR1, HR2 are very small, so that the maximum potential of the memory node n1 during writing operation, which is obtained from the expression (1), is not likely to rise as high as the supplied potential Vdd. If the polysilicon high resistances HR1, HR2 are set to have smaller resistance values in order to obtain the pull-up effect, the current consumption increases during non-operating conditions. The condition of $$V1 > Vt2 \tag{2}$$

must be satisfied to hold data in the flip-flop of the memory cell 1, wherein the maximum potential V1 is given by the expression (1), and Vt2 is a threshold voltage of the n-channel MOS transistors N1, N2. Thus, when writing data, it is necessary to satisfy the following condition obtained by substituting expression (1) into expression (2):

$$Vw1 - Vt1 - Vb = Vdd - Vt1 - Vb > Vt2 \tag{3}$$

If a writing operation is carried out under conditions such that expression (3) is not satisfied, both of the n-channel MOS transistors N1 and N2 in the flip-flop assume their off-state and therefore will not be able to hold data in the memory cell 1. In this non-operating state wherein the memory cell 1 does not function as a flip-flop, when noise enters memory cell 1 or a reading operation begins erroneously, the data in the memory cell 1 are easily destroyed.

While, according to semiconductor technology, it is necessary to satisfy Vdd>2.4 v on the assumption that Vt1=Vt2=0.9 v, Vb=0.6 V. This means that the SRAM of the prior art cannot be written to or read properly unless the supplied voltage Vdd is higher than 2.4 v.

Table calculators commonly require an electric battery as a power source, with a source voltage of 3v, for example. However, the voltage value of the battery drops during its lifetime. When the SRAM of the prior art is powered, in such a calculator, by the 3 volt battery, the frequency of the battery change will increase because the SRAM will not work after the voltage drop becomes more than 0.6 v.

On the other hand, there is known a fully CMOS type memory cell in which p-channel MOS transistors are used instead of polysilicon high resistances HR1, HR2, and an SRAM constituted by the fully CMOS type memory cells is driven by a low supply voltage. However, this type of memory cell tends to have a larger size because it must be provided with an isolation region for device isolation between an n-channel MOS transistor and a p-channel MOS transistor, as known in semiconductor technology. In contrast, memory cells of high resistance type have the benefit of smaller cell size since it is possible to form a three-dimensional structure with polysilicon high resistance on an insulation film covering the n-channel MOS transistor. However, an SRAM equipped with memory cells of the high resistance type has the drawback that it cannot be operated with a low voltage power supply as mentioned above.

Consequently, two methods are proposed in order to satisfy expression (3), above, in use of a low voltage power supply in such a manner that memory cells of the high resistance type can be operated properly.

One of these methods is to lower the threshold voltages Vt1, Vt2, and the other is to decrease the voltage drop Vb caused by the backgate effect. To decrease the threshold voltages Vt1, Vt2 complicates the process conditions and causes deterioration of memory cell stability due to changing the threshold voltage of n-channel MOS transistors N1, N2, N3, and N4. Hence this method is not practical. To decrease the value of the voltage Vb during writing operations is not practical, either. Because the substrate capacitance of the memory cell is large, this method induces increases in electricity consumption by added control circuits.

SUMMARY OF THE INVENTION

It is an object of the present invention to provide a semiconductor memory device together with a data processing device, with the memory device being constructed with an SRAM in which a memory cell having high load resistances, load MOS's or thin film type load elements are formed, but the memory device is not a fully CMOS type memory cell.

A further object of the invention is to reduce the size of the memory cells and the attendant electric consumption, while allowing writing operations to be powered by a simple battery forming a low voltage power supply.

In accordance with the present invention, there is provided a semiconductor memory device having at least one memory cell. The memory cell is composed of a flip-flop which includes two circuits, each connected between a first supplied potential (for example, high level potential) and a second supplied potential (for example, low level potential), respectively. One of the circuits is constituted by a first load means (for example, a polysilicon high resistance, a load MOS, a thin film transistor, or the like) and a first insulated gate field effect transistor serially connected to the load means, while the other circuit is constituted by a second load means (for example, a polysilicon high resistance, a load MOS, a thin film transistor, or the like) and a second insulated gate field effect transistor serially connected to the second load means. The memory cell also has insulated gate field effect transistors for access to the flip-flop which are connected between a memory node and a bit line in the flip-flop and which have gate inputs for receiving the potential on a word line.

The memory device of the present invention is characterized in that it has a word line potential deviating means which acts to set the word line potential during a writing operation to be a writing potential. The value of the writing potential is higher than both of the supplied potentials. The word line potential deviating means is provided with deviation repeating means which repeats to change a potential up and down alternately in a manner such that the lower-side potential is controlled to fall between the supplied potentials, whereas the upper-side potential is to be the same as the writing potential. The word line potential deviating means is also provided with a multiple-stage step-up means which generates the writing potential.

A preferred embodiment of the word line potential deviating means has a pulse generating means, a deviation timing signal generating means, a stepped-up potential generating means, a voltage step-up control signal generating means, a word line supplied potential synthesizing means, and a word line potential supply control means. The pulse generating means repeats to output pulses during the data writing operation. On the basis of the generated pulses, the deviation timing signal generating means provides a plurality of cycles of a prescribed timing signal. The stepped-up potential generating means generates a stepped-up potential which is higher than the supplied potential of high level in accordance with the prescribed timing signal. The voltage step-up control signal generating means produces a step-up control signal on the basis of the prescribed timing signal. The level of control signal is set to be higher than that of the supplied potential of the higher side. The word line supplied potential synthesizing means selectively synthesizes the stepped-up potential provided from the stepped-up potential generating means and the high level potential from the power supply on the basis of the step-up control signal, so that it produces the word line supplied potential in the form of serial pulses. The word line potential supply control means controls the supply of the word line supplied potential to the word line on the basis of the prescribed timing signal and the step-up control signal. In order to perform the step-up operation of the word line potential during a reading operation, improved peripheral circuitry is provided according to the present invention, which produces the potential of the data line. More specifically, the peripheral circuitry has a potential setting detection means for detecting a point when a selected word line is set to be the writing potential during the reading operation, and a sense amplifier control means which sends out a sense amplifier control signal for activating the sense amplifier means on the basis of the output of the potential setting detection means.

According to the above arrangement of the present invention, the word line potential is set to be the stepped-up potential which is higher than the supplied potential by means of the word line potential deviating means. The stepped-up potential is applied to the gate of the insulated gate field effect transistor for access to the flip-flop in the memory cell. When the potential of the bit line is 'H', the writing potential is transferred via the transistor to the memory nodes of the memory cell, the value of the writing potential being the difference between the stepped-up potential and a threshold voltage vt including the voltage drop due to the backgate effect). In case the difference in potential is larger than the threshold voltage of the insulated gate field effect transistor of the flip-flop, the proper writing operation is carried out.

Thus, according to the present invention, even if a power supply of low output voltage is utilized, the writing operation can be carried out without any trouble because the gate is applied with the stepped-up potential higher than the supplied potential. In other words, the present invention permits use of a low voltage power supply, and furthermore makes possible a reduction of the number of batteries required to activate the transistors.

It is possible to maintain the potential of a selected word line to be a stepped-up potential during the writing period. It is, however, preferable to have the deviation repeating means perform a repeating up and down operation of the potential between the stepped-up voltage and the low level supplied potential during data writing operations. With the deviation repeating means, the data writing can be carried out in a multiple-check manner to write the same data repeatedly, whereby erroneous data writing can be avoided. Where the word line potential deviating means is provided with the multiple-state step-up means which generates the stepped-up potential obtained by multiple stages of the stepping up operation, the stepped-up potential can surely be held high enough.

As described above, according to the present invention, the word line is supplied with the stepped-up potential by the word line potential deviating means instead of the supplied potential. However, there occurs a time lag between the start of supplying potential and the finish of setting the word line to be at the prescribed stepped-up potential. According to a preferred embodiment, in order to avoid such time lag, the peripheral circuit related to the data line is constituted by the potential setting detection means to detect when the word lines are set to be at the writing potential during the reading operation, and by the sense amplifier control means which sends the sense amplifier control signal to the sense amplifier means on the basis of the output of the potential setting detection means. This circuit configuration makes it possible to eliminate a period for relaxation of amplified potential of inverted data which emerges on the data line when noise is present during the step-up operation, since the sense amplifier is activated after setting the potential of the word line to a prescribed value. Therefore, the sense amplifier cannot amplify the data. Hence it becomes easy to avoid reading errors and to adjust the timing of various signals in the circuits connected to the sense amplifier.

DESCRIPTION OF THE PREFERRED EMBODIMENTS

The invention will now be described in detail with reference to the attached drawings.

Figure 1:
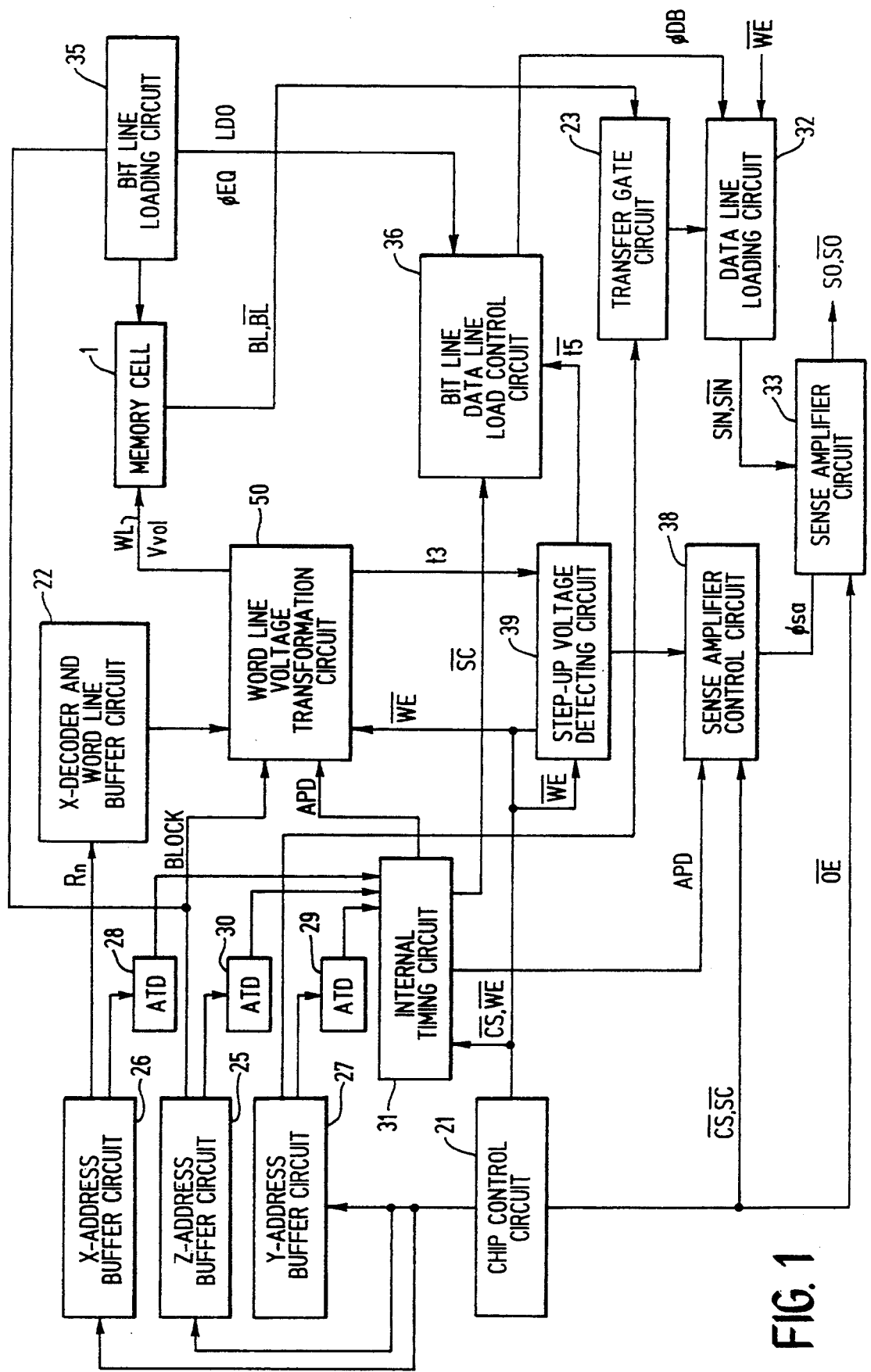
FIG. 1 is a block diagram showing an entire static-RAM equipped with polysilicon memory cells of the high resistance type according to a preferred embodiment of the present invention.
Figure 2:
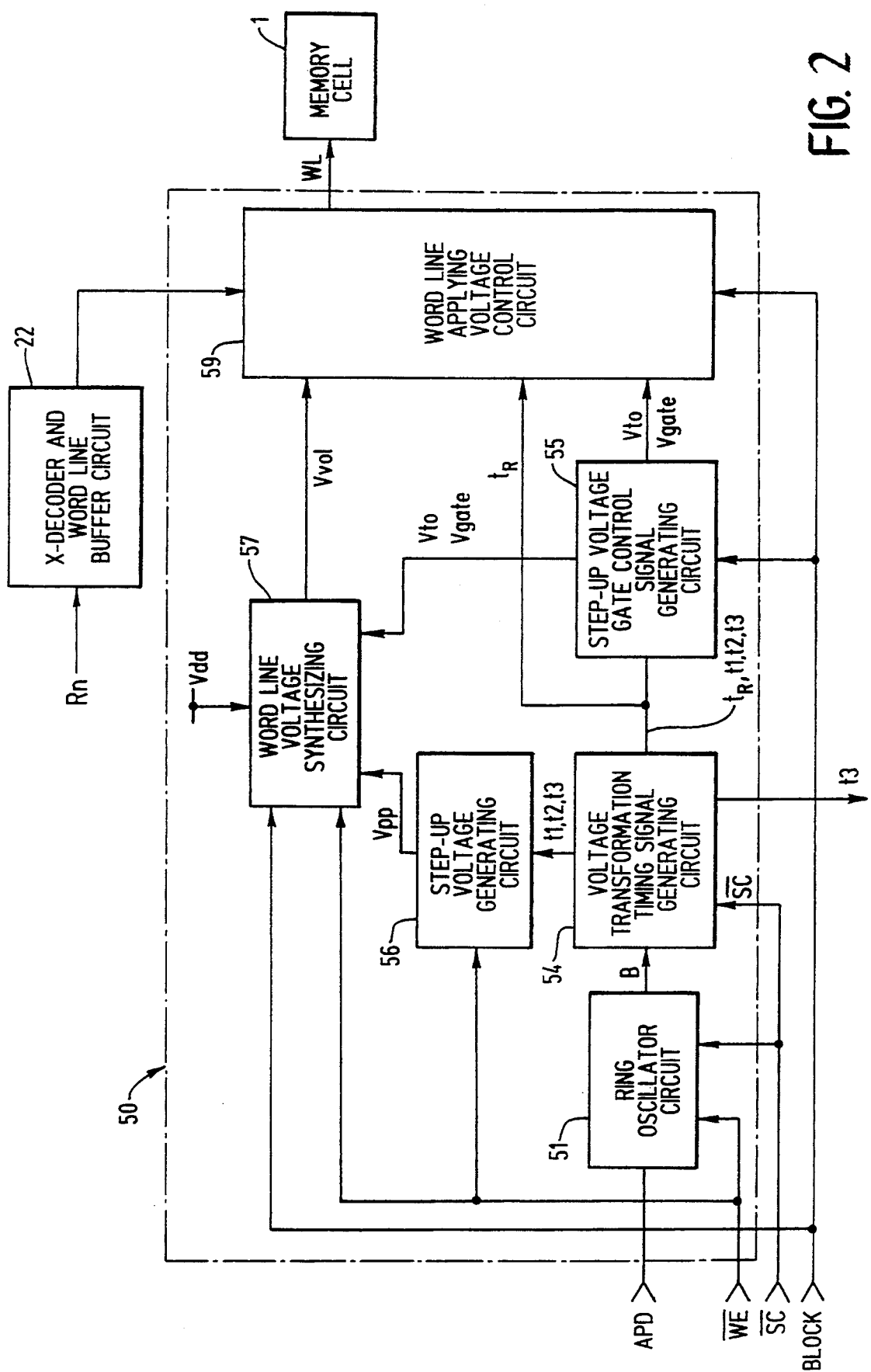
FIG. 2 is a block diagram showing a portion of the peripheral circuits in the semiconductor memory device of FIG. 1, the portion relating mainly to the writing operation.
Figure 21:
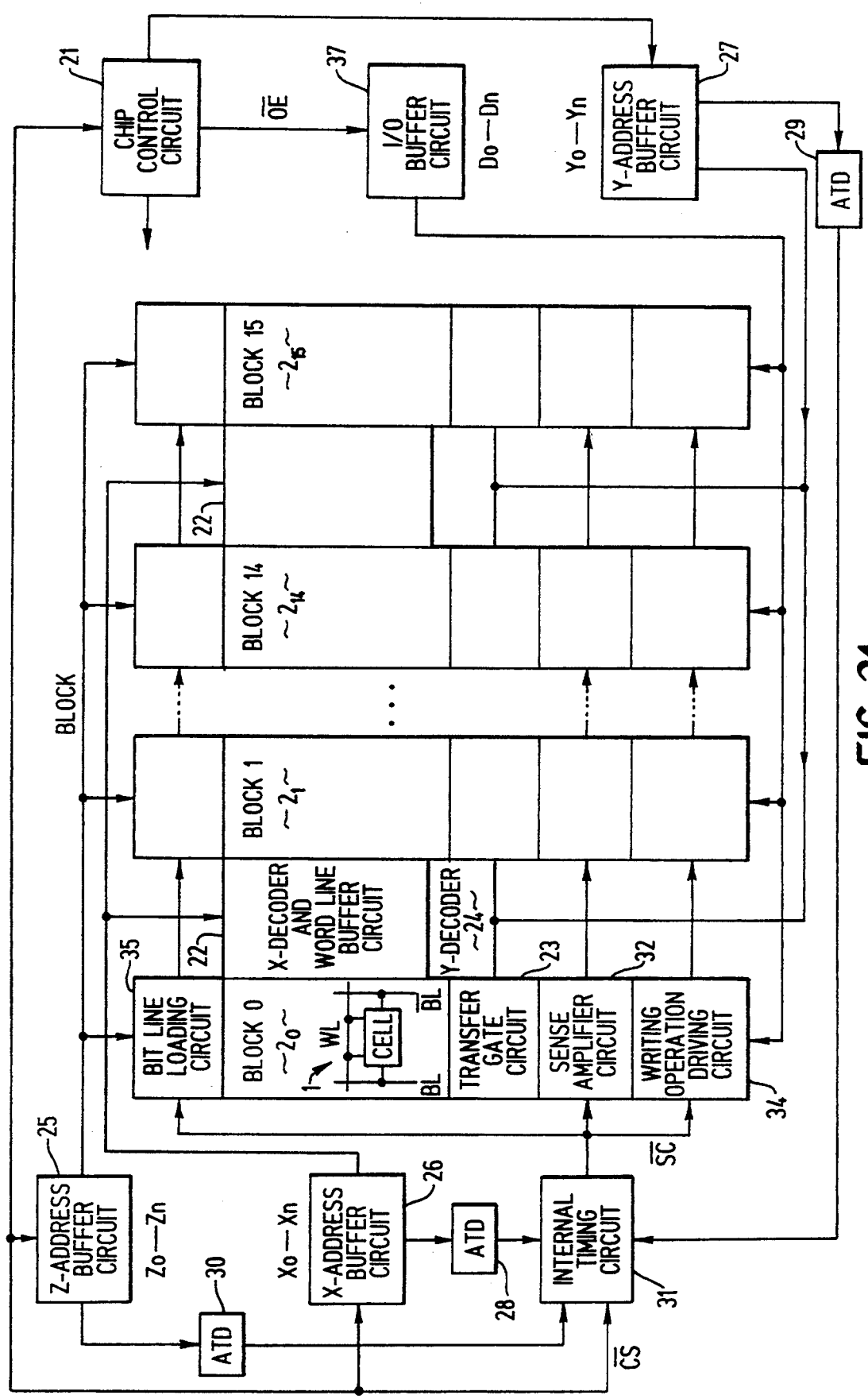
FIG. 21 is a block diagram showing an exemplary structure for a static RAM.
Figure 22:
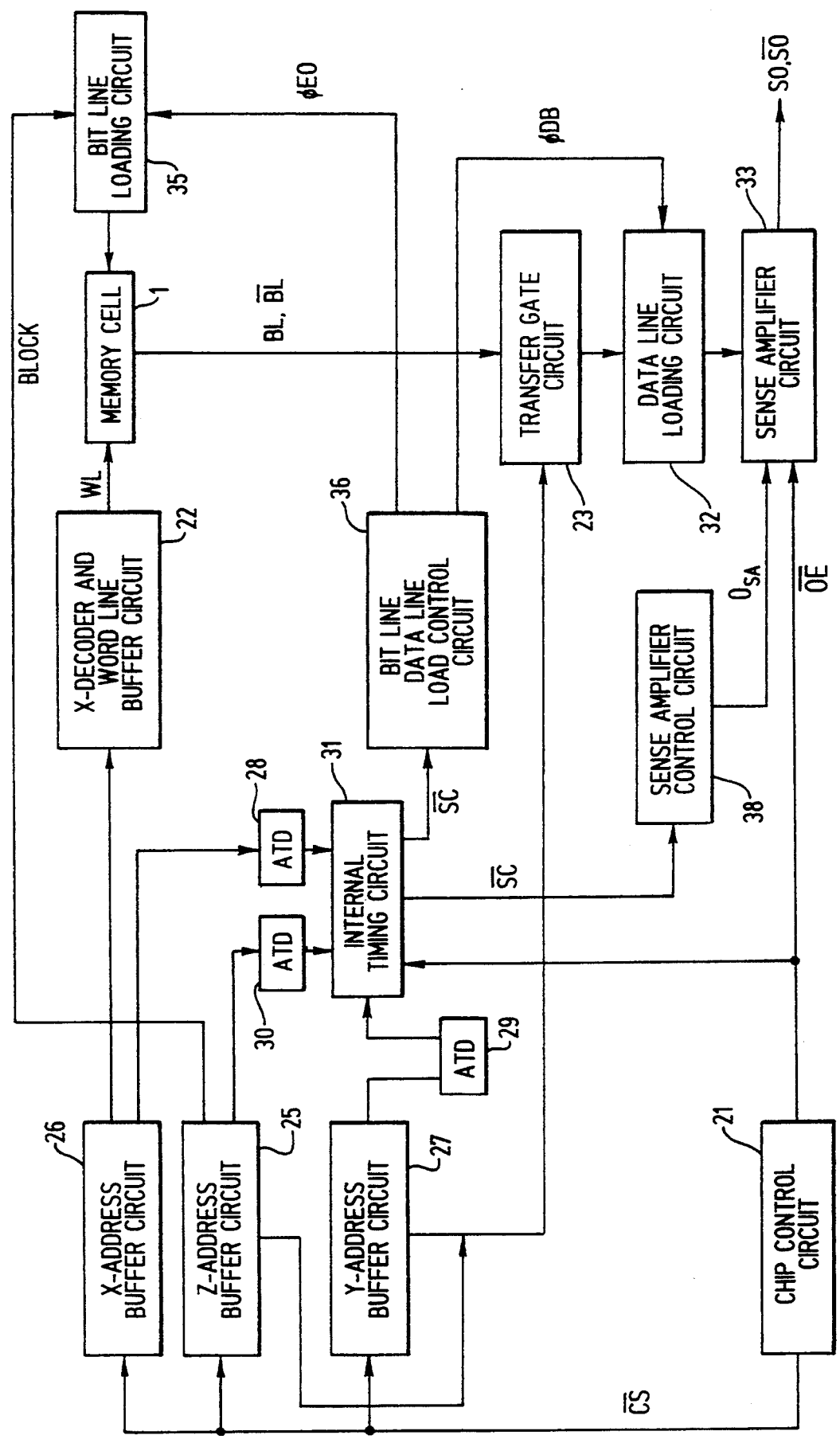
FIG. 22 is a block diagram showing the peripheral circuit in a static RAM of the prior art.
Figure 23:
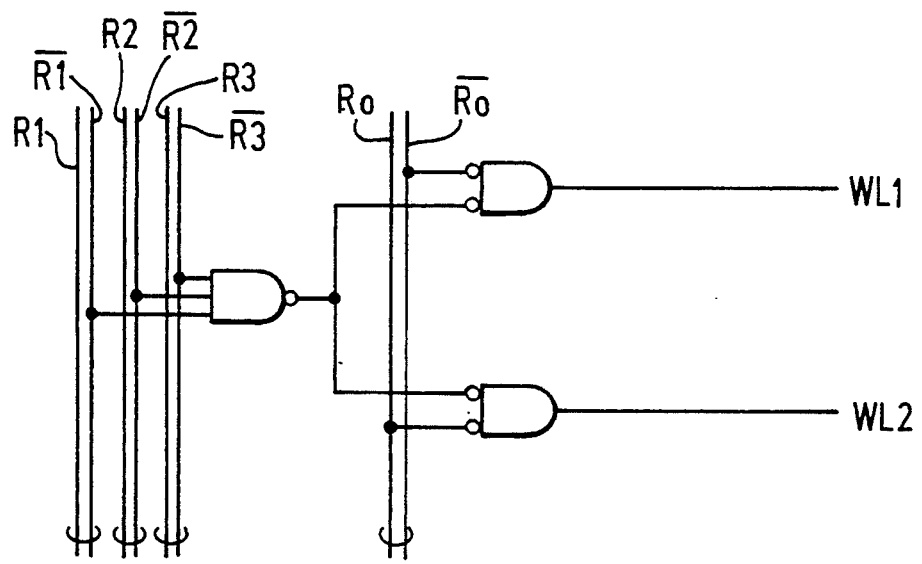
FIG. 23 illustrates in detail an X-decoder and a word line buffer circuit of the prior art circuit of FIG. 22; and, FIG. 24 illustrates a memory cell of the high resistance type in the static RAM of FIG. 22.
Figure 24:
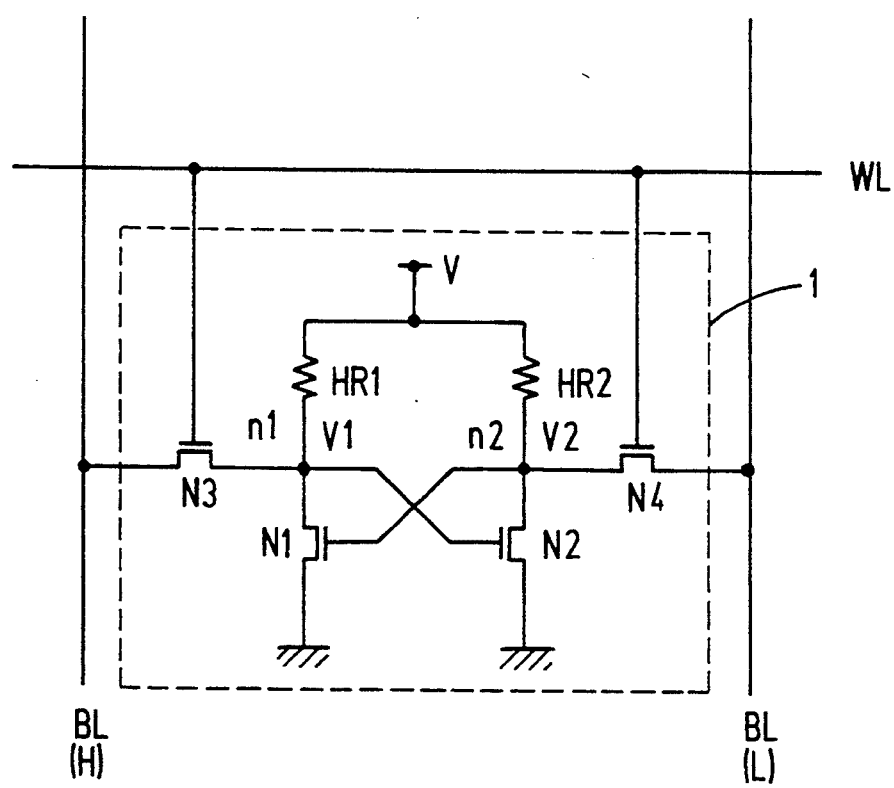

FIG. 1 is a block diagram of an embodiment of the present invention, wherein circuits of an SRAM having monolithic polysilicon memory cells of high load type are generally illustrated. FIG. 2 is a block diagram which illustrates circuit portions of the SRAM relating mainly to writing operations. The components shown in FIG. 1 which correspond to those shown in FIGS. 21 and 22 are designated by the same reference numerals will not be described again.

For this embodiment, a word line pulse-driving method is adopted. When a certain word line WL is selected, in order to reduce the amount of current flowing into a memory cell 1, an internal timing circuit 31 generates an automatic power down signal APD in response to basic pulses generated by address-transition detection circuits (ATD) 28, 29 and 30, and thereby the word line WL is operated by a pulse-driving method during a predetermined period of time. A chip control circuit 21 generates a chip selecting signal $\overline{CS}$, a write enable signal $\overline{WE}$ and an output enable signal $\overline{OE}$.

One novel feature of this embodiment is a word line voltage transformation circuit 50 provided to maintain the value of potential on the word line WL to be higher than that of the source voltage Vdd when the word line WL is selected for a writing operation. An internal arrangement of the word line voltage transformation circuit 50 is shown in FIG. 2. This transformation circuit 50 is constituted by a ring oscillator circuit 51, a voltage transformation timing signal generating circuit 54, a step-up voltage gate control signal generating circuit 55, a step-up voltage generating circuit 56, a word line supplying voltage synthesizing circuit 57 and a word line applying voltage control circuit 59.

The ring oscillator circuit 51 generates recurring pulses based on a system control signal $\overline{SC}$ from internal timing circuit 31.

Figure 3:
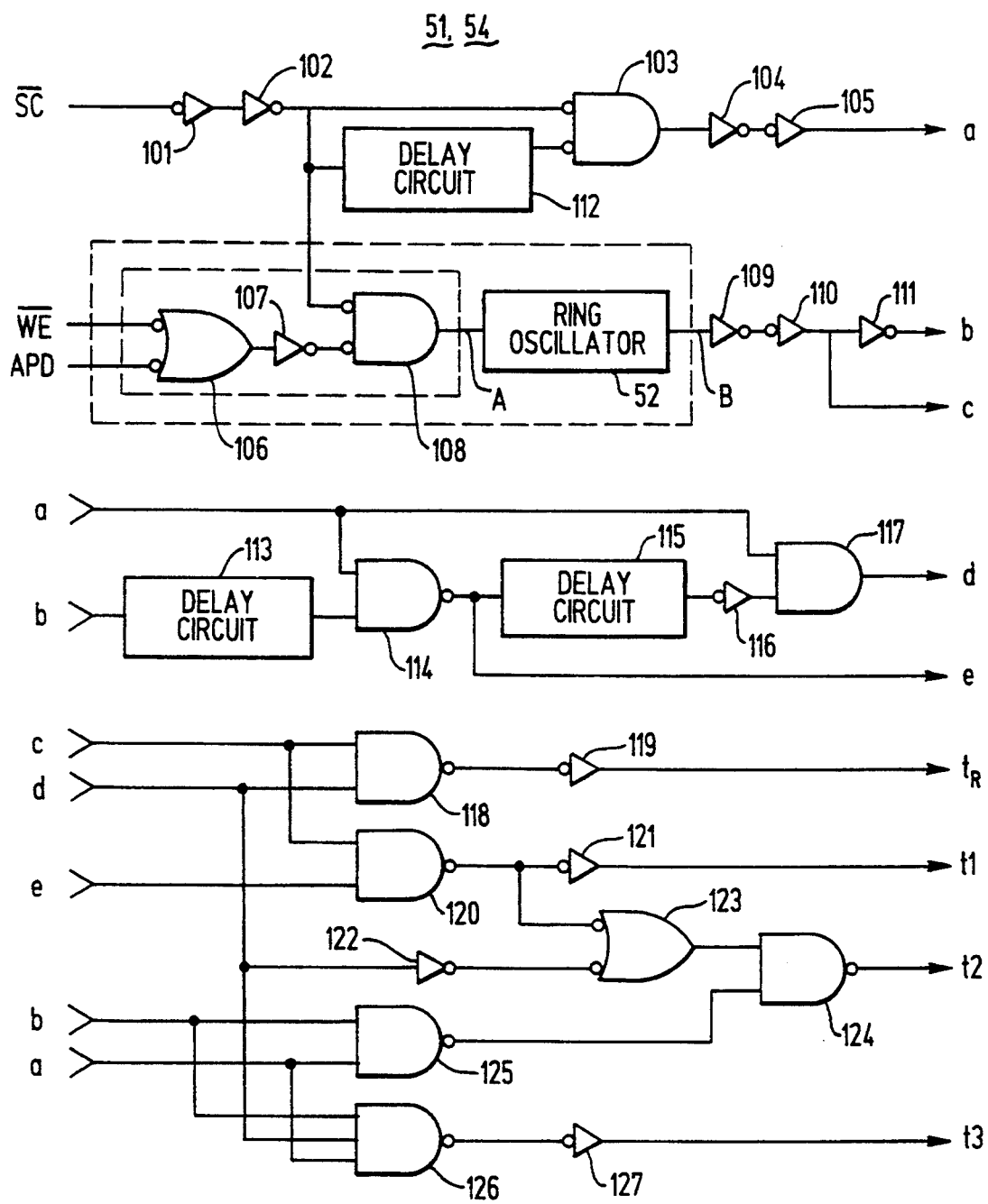
FIG. 3 illustrates a ring-oscillator circuit and a deviation timing signal generating circuit of the peripheral circuit of FIG. 2.
Figure 4:
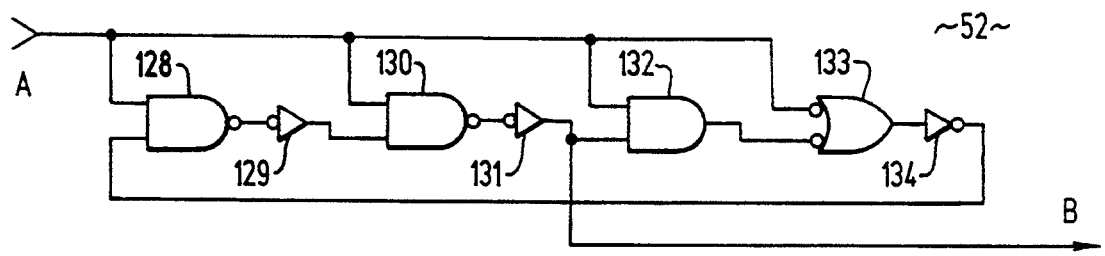
FIG. 4 illustrates in detail a ring-oscillator in the ring-oscillator circuit of FIG. 3.

As shown in FIG. 3, the ring oscillator circuit 51 is constituted by a ring oscillator 52 and a selective driving circuit 53. The selective driving circuit 53 activates the oscillator 52 selectively based on input of the automatic power down signal ADP, the write enable signal $\overline{WE}$ and the system control signal $\overline{SC}$. The ring oscillator 52 is, as shown in FIG. 4, constituted by connecting a plurality of logic circuits 128–134 in the form of a loop, and generates a pulse train, or recurring spaced pulses, as long as an input A ([H]) is supplied as the output from the selective driving circuit 53.

The voltage transformation timing signal generating circuit 54 is shown in FIG. 3. Generating circuit 54 is composed of logic circuits and delay circuits, and produces preset timing signals $t_R$, t1, t2 and t3, each of which has substantially the same pulse amplitude as that of the source voltage Vdd. These signals are generated in accordance with. i.e. in response to, the recurring oscillation pulses B produced by ring oscillator 52 when the system control signal $\overline{SC}$ is applied.

Based on the timing signals $t_R$, t1, t2, t3 and a block signal BLOCK, the step-up voltage gate control signal generating circuit 55 generates step-up voltage gate control signals Vto and Vgate, and thereby a gate of a preselected MOS transistor in the word line voltage transformation circuit 50 is driven selectively.

Figure 5:
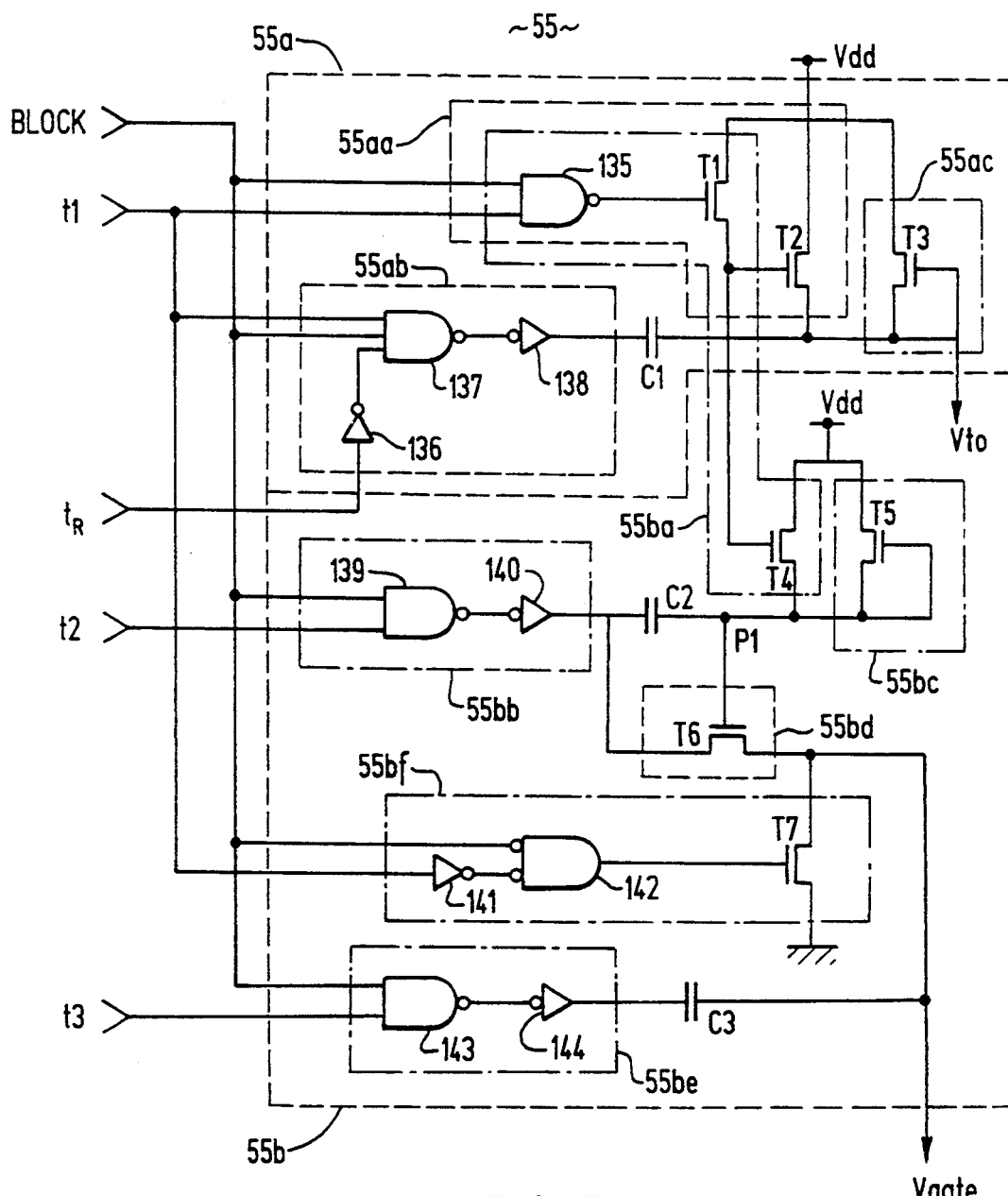
FIG. 5 illustrates in detail a step-up gate control signal generating circuit in the peripheral circuit of FIG. 2.

The circuit arrangement of the control signal generating circuit 55 is shown in FIG. 5. The signal generating circuit 55 has a first step-up voltage gate control signal generating circuit 55a which generates the step-up voltage gate control signal Vto, and a second step-up voltage gate control signal generating circuit 55b which generates the step-up voltage gate control signal Vgate.

The first step-up voltage gate control signal generating circuit 55a is constituted by a charge injection circuit 55aa which charges a voltage step-up capacitor C1 based on the timing signal t1 and the block signal BLOCK, a potential applying circuit 55ab which increases the voltage appearing on the negative pole of the capacitor C1 when it receives the block signal BLOCK and timing signals $t_R$ and t1, and a limiting circuit 55ac which controls the value of the step-up voltage gate control signal Vto so as not to be higher than the required voltage value. One of the electrodes of the capacitor C1 is formed in a first layer of polysilicon in which a gate electrode is formed. The other electrode of the capacitor C1 is formed in a second polysilicon layer separated from the first polysilicon layer by an insulating layer constituting the capacitor dielectric. The second polysilicon layer is of high resistance polysilicon.

The second step-up voltage gate control signal generating circuit 55b has a first step charge injection circuit 55ba, a part of which is common to part of the charge injection circuit 55aa of the first control signal generating circuit 55a, which charges a first voltage step-up capacitor C2 when it receives the timing signal t1 and the block signal BLOCK. The circuit 55b also has a first step potential applying circuit 55bb which increases the potential appearing on the negative pole of the capacitor C2 when it receives the timing signal t2 and the block signal BLOCK, a limiting circuit 55bc which protects a MOS transistor T6 in the charge injection circuit 55bd from damage while the potential is raised, a potential transfer circuit 55bd which sends out the potential appearing on the negative pole of the capacitor C2, a second step potential applying circuit 55be which raises the potential appearing on the negative pole of a second voltage step-up capacitor C3 when it receives the block signal BLOCK and the timing signal t3, and a discharging circuit 55bf which discharges the capacitor C3 under control of the block signal BLOCK and the timing signal tl. The first step charge injection circuit 55ba, the voltage step-up capacitor C2, the potential applying circuit 55bb and the limiting circuit 55bc constitute a charging circuit for the second voltage step-up capacitor C3.

One electrode of each of the step-up capacitor C2 and C3 is formed in the first layer of polysilicon in which the gate electrode is also formed. The other electrode of each capacitor is formed in the second polysilicon layer separated by the insulating layer. This second polysilicon layer is of a high resistance polysilicon.

Figure 6:
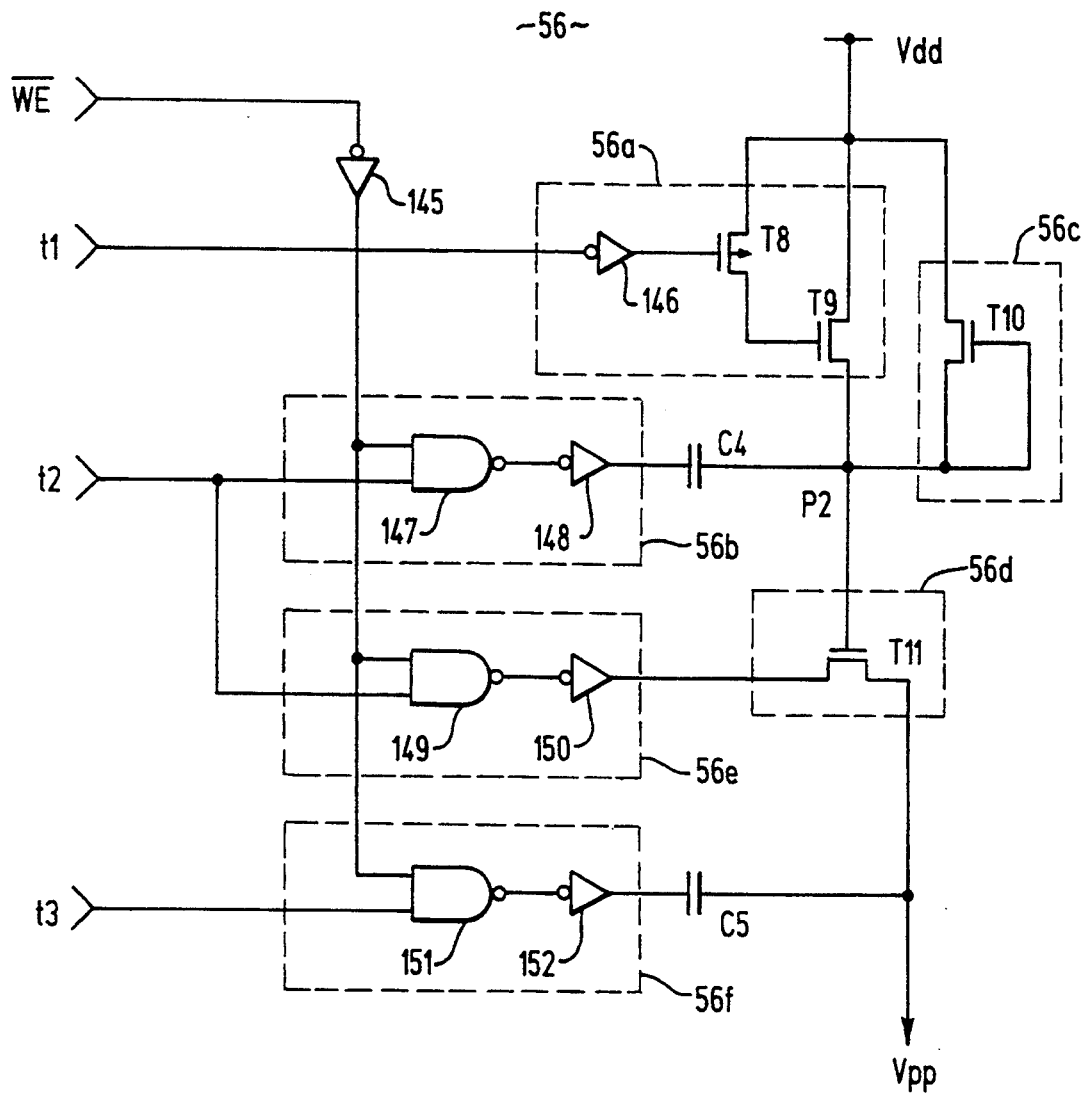
FIG. 6 illustrates in detail a stepped-up potential generating circuit in the peripheral circuit of FIG. 2.

The step-up voltage generating circuit 56 generates a step-up voltage Vpp on the basis of the source voltage Vdd when it receives the timing signals t1, t2, t3 and the write enable signal $\overline{WE}$. The value of the voltage Vpp is higher than that of the source voltage Vdd. A circuit arrangement of this generating circuit 56 is shown in FIG. 6. The generating circuit 56 is constituted by a first step charge injection circuit 56a for charging a first voltage step-up capacitor C4 when it receives the timing signal t1, a first step potential applying circuit 56b for raising the potential of the negative pole of the capacitor C4 when it receives the write enable signal $\overline{WE}$ and the timing signal t2, a potential transfer circuit 56d, a limiting circuit 56c for protecting a MOS transistor T11 in the voltage transfer circuit 56d from damage during the voltage increasing operation, a voltage applying circuit 56e which applies the source voltage Vdd to the potential transfer circuit 56d when it receives the write enable signal $\overline{WE}$ and the timing signal t2, and a second step potential applying circuit 56f for raising the potential of the negative pole of a voltage step-up capacitor C5. One electrode of each step-up capacitor C4 and C5 is formed in the first layer of polysilicon in which the gate electrode is also formed. The other electrode of each capacitor C4 and C5 is formed in the second polysilicon layer separated from the first polysilicon layer by an insulating layer serving as the capacitor dielectric. The second polysilicon layer is of high resistance polysilicon.

The word line supplying voltage synthesizing circuit 57 produces a word line supplying voltage $V_{VOL}$ on the basis of either the source voltage Vdd or the step-up voltage Vpp in accordance with the write enable signal $\overline{WE}$, the block signal BLOCK, the timing signal $t_R$ and the step-up gate control signals Vto and Vgate. This word line supplying voltage $V_{VOL}$ is supplied to the word line WL.

Figure 7:
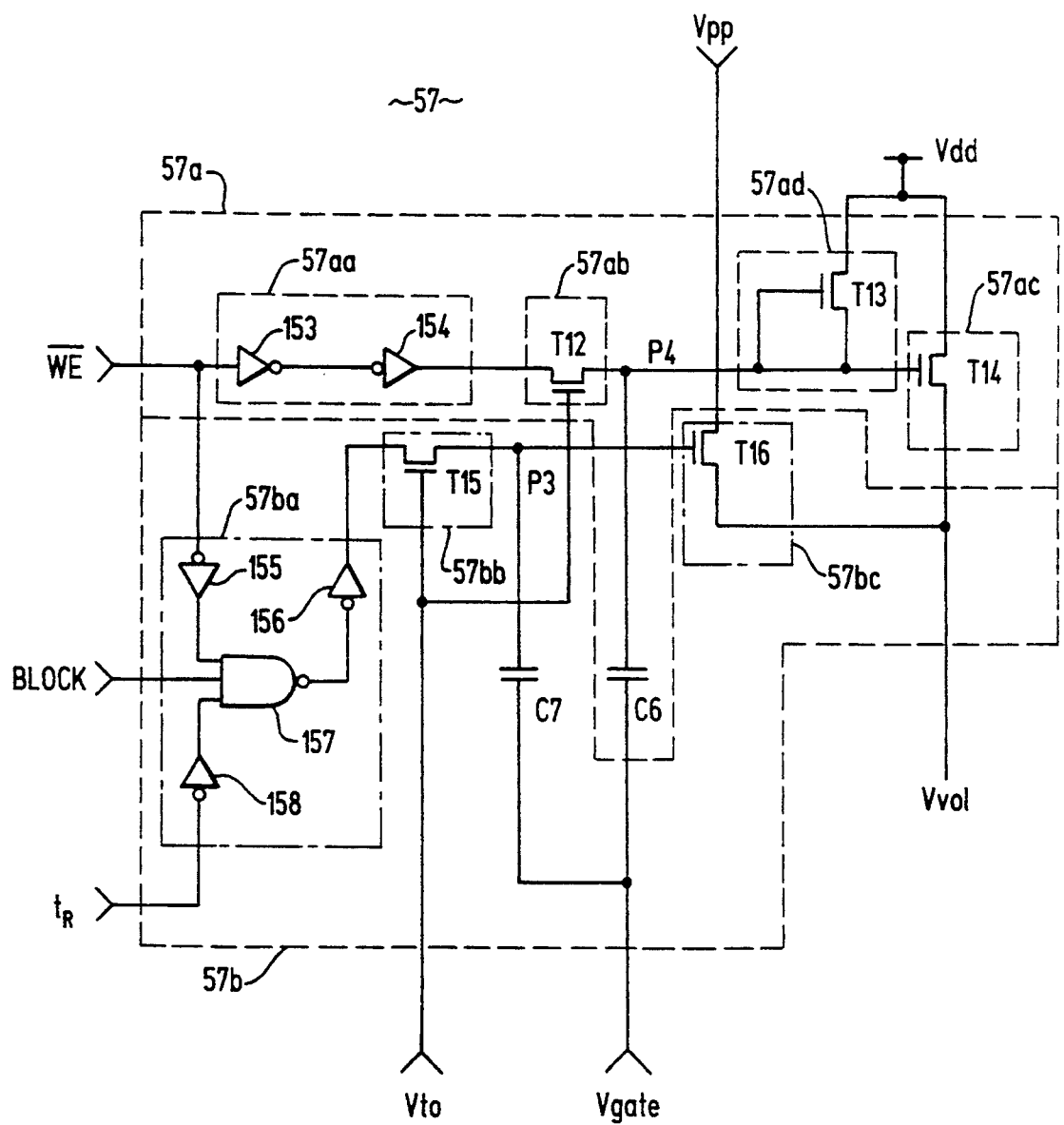
FIG. 7 illustrates in detail a word line supplied potential mixing circuit in the peripheral circuit of FIG. 2.

An arrangement of the word line supplying voltage synthesizing circuit 57 is shown in FIG. 7. This synthesizing circuit 57 has a source voltage supplying portion 57a and a step-up voltage supplying portion 57b. The source voltage supplying portion 57a supplies a voltage, the value which is substantially the same as that of the source voltage Vdd, to the word line applying voltage control circuit 59 during a read operation in accordance with the write enable signal $\overline{WE}$ and the step-up voltages gate control signals Vto, Vgate. The step-up voltage supplying portion 57b supplies intermittently and periodically a potential which is nearly the same as the step-up voltage Vpp during a writing operation in accordance with the block signal BLOCK, timing signal $t_R$ and step-up voltage gate control signals Vto and Vgate.

The source voltage supplying portion 57a has a buffer circuit 57aa to which the write enable signal $\overline{WE}$ is applied, a potential transfer circuit 57ab controlled by the step-up voltage gate control signal Vto, a voltage step-up capacitor C6 whose voltage is increased when it receives the step-up voltage gate control signal Vgate, a potential transfer circuit 57ac controlled by the charge potential of the capacitor C6, and a limiting circuit 57ad for protecting a MOS transistor T14 in a potential transfer circuit 57ac against breakdown.

The step-up voltage supplying portion 57b has a logic circuit 57ba which receives the write enable signal $\overline{WE}$, the block signal BLOCK, and the timing signal $t_R$, a potential transfer circuit 57bb controlled by the step-up voltage gate control signal Vto, a voltage step-up capacitor C7 whose voltage value is increased when it receives the step-up voltage gate control signal Vgate, and a potential transfer circuit 57bc which is controlled by the charge voltage of the capacitor C7. The electrode at one side of each step-up capacitor C6 and C7 is formed in the first layer of polysilicon in which the gate electrode is also formed. The electrodes at the other side of each capacitor C6 and C7 is formed in the second polysilicon layer separated from the first polysilicon layer by an insulating layer. This second layer is of high resistance polysilicon.

Figure 8:
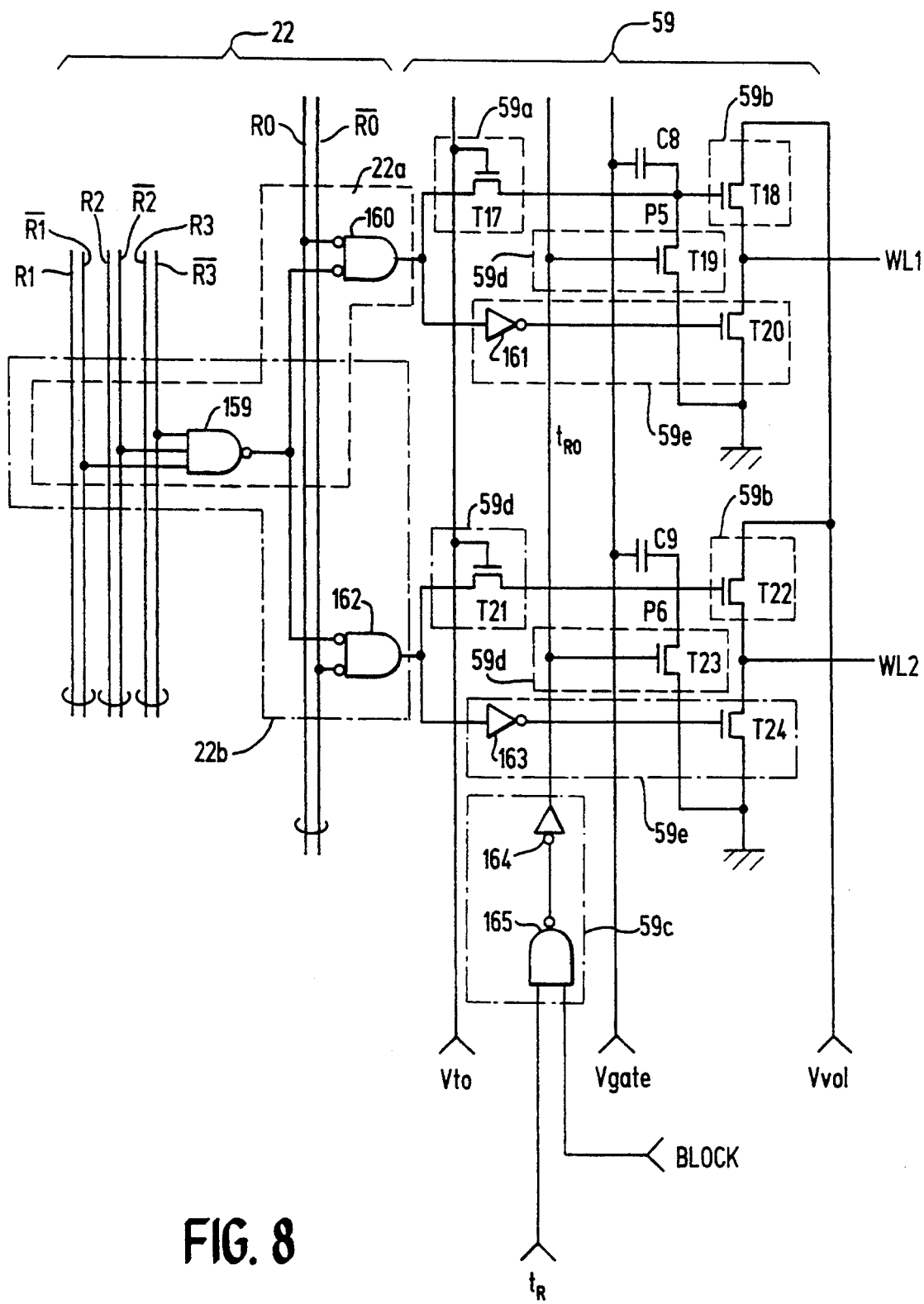
FIG. 8 illustrates in detail an X-decoder and a word line buffer circuit, and a word line potential supplying control circuit in the peripheral circuit of FIG. 2.

The word line applying voltage control circuit 59 serves to apply the word line supplying voltage Vvol to the word line WL in accordance with the block signal BLOCK, the timing signal $t_R$, the step-up voltage gate control signals Vto, Vgate and the output of a word line buffer circuit with X-decoder 22. As shown in FIG. 8, although the word line buffer circuit with X-decoder 22 is of a conventional type, the word line applying voltage control circuit 59 is interposed, according to the invention, between the buffer circuit 22 and the memory cell 1. An arrangement of this control circuit 59 is shown in FIG. 8. This control circuit 59 is constituted by a first potential transformation circuit 59a which compensates the decreased potential value of the output of the word line buffer circuit with X-decoder 22 and then sends out the compensated potential, a voltage step-up capacitor C8 (or C9) whose voltage value is increased when the step-up voltage gate control signal Vgate is applied thereto, a second potential transformation circuit 59b for transforming the word line supplying voltage Vvol in response of the step-up voltage of the aforesaid capacitor C8 (or C9), a discharge timing circuit 59c which generates a discharge timing signal $t_{RO}$ based on the block signal BLOCK and the timing signal $t_R$, a voltage step-up capacitor discharging circuit 59d for discharging the voltage step-up capacitor C8 (or C9) according to the above discharge timing signal $t_{RO}$, and a word line discharging circuit 59e for rapidly discharging electricity appearing on the word line WL if this word line WL is not selected. Electrodes at one side of each step-up capacitor C8 and C9 are formed in the first layer of polysilicon in which the gate electrode is also formed. Electrodes of the other side of these capacitors are formed in the second polysilicon layer separated from the first polysilicon layer by an insulating layer. This second polysilicon layer is of high resistance polysilicon.

In the present embodiment, there is provided an additional circuit for controlling the read operation. The reason for providing the control circuit will be described later.

Figure 9:
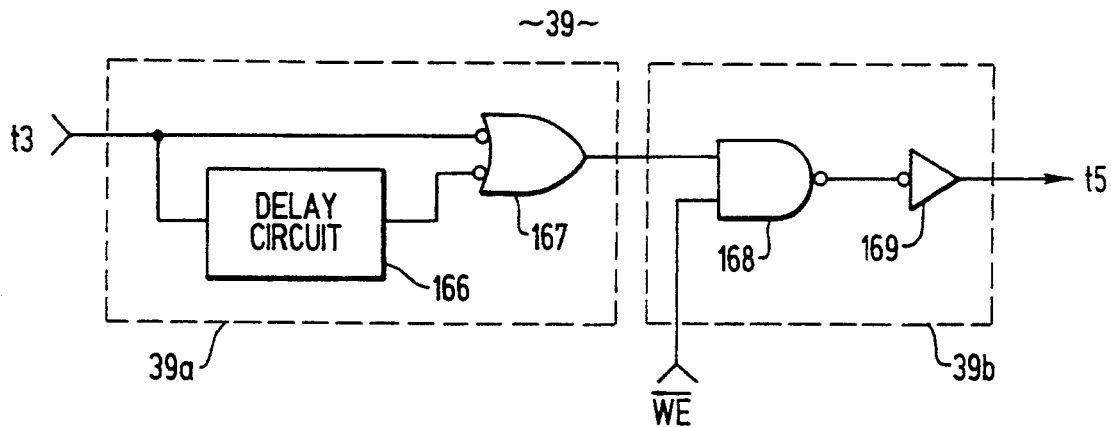
FIG. 9 illustrates in detail a step-up detecting circuit in the peripheral circuit of FIG. 2.
Figure 10:
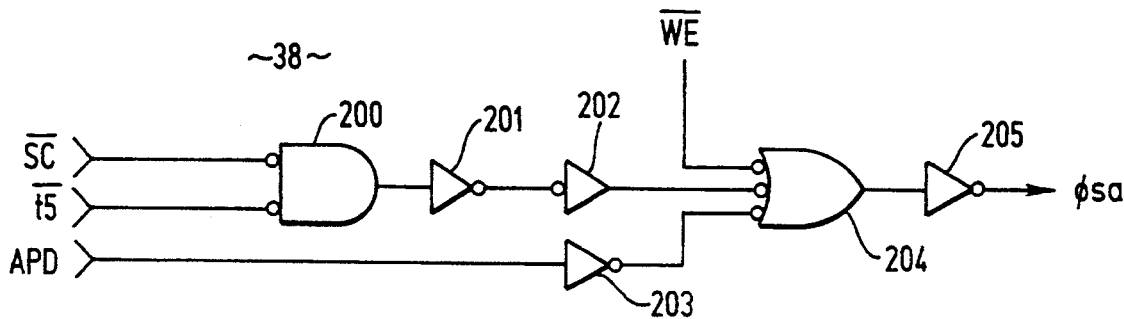
FIG. 10 illustrates in detail a sense amplifier control circuit in the peripheral circuit of FIG. 2.
Figure 11:
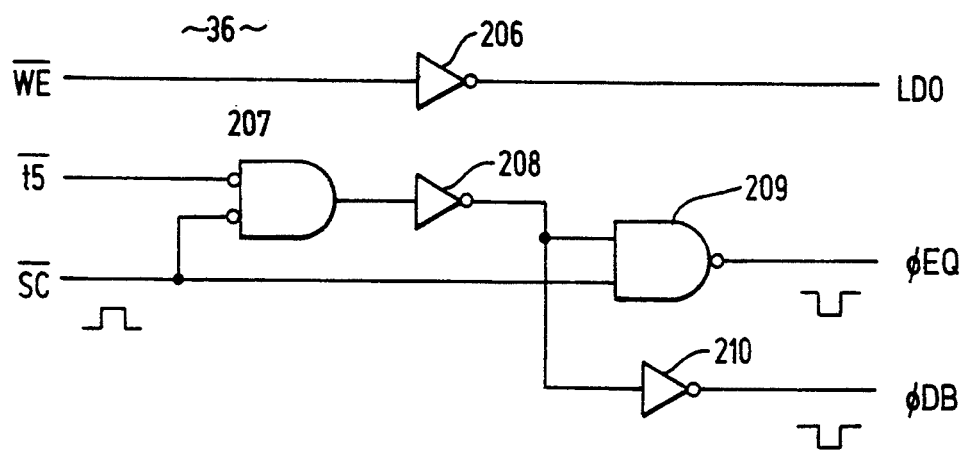
FIG. 11 illustrates in detail a bit-data line loading control circuit in the peripheral circuit of FIG. 2.
Figure 12:
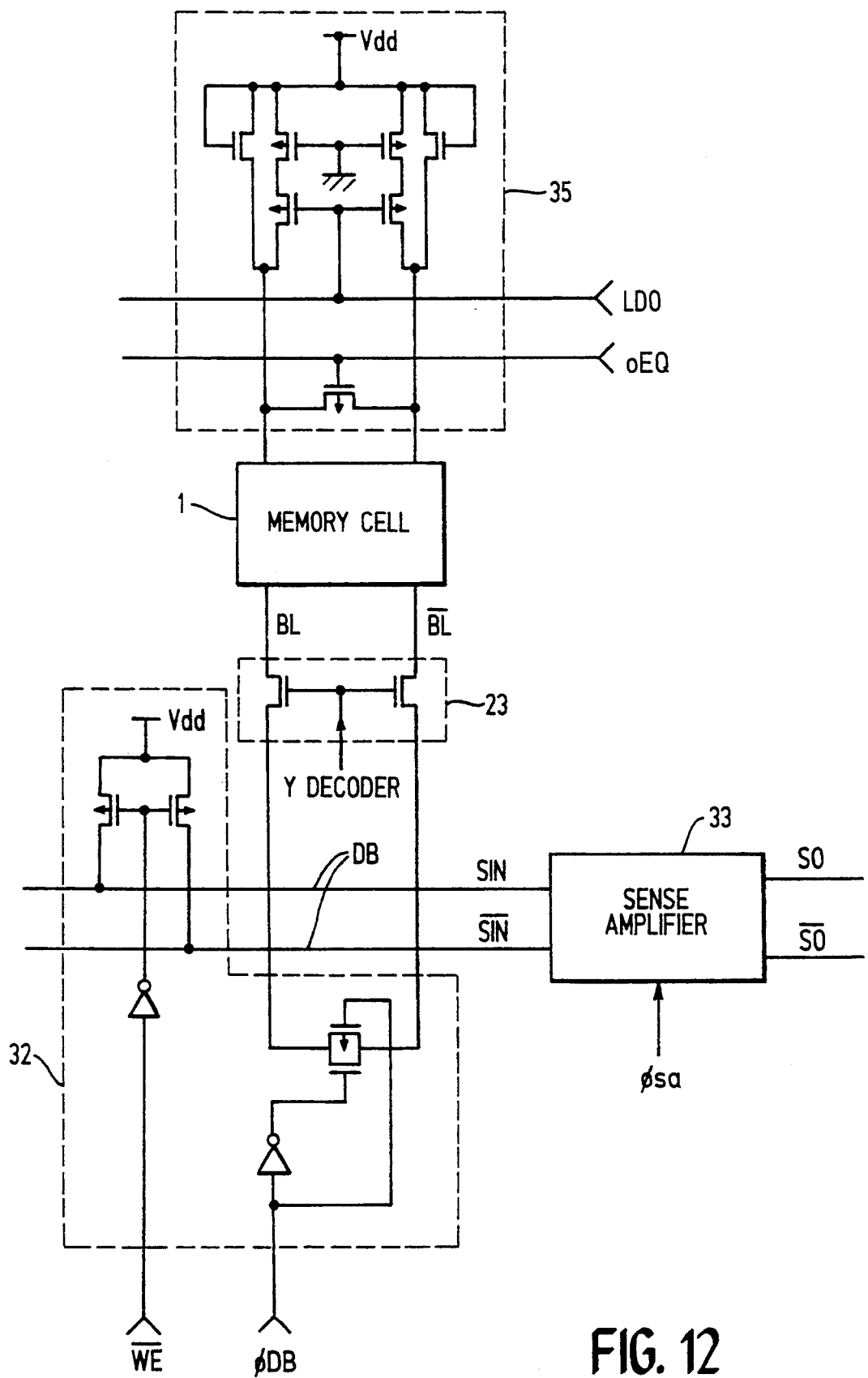
FIG. 12 illustrates in detail a bit line loading circuit and a data line loading circuit in the peripheral circuit of FIG. 2.

The step-up voltage detection circuit 39 of FIG. 1 detects the completion of the voltage step-up operation of the word line WL in accordance with the timing signal t3 from the word line voltage transformation circuit 50, and the write enable signal $\overline{WE}$ and, in response, delivers the timing signal t5 to the sense amplifier control circuit 38 and bit/data line loading control circuit 36. As shown in FIG. 9, the voltage step-up circuit 39 comprises a delay circuit 39a for delaying the timing signal t3 by a prescribed duration, the timing signal t3 being used for determining the point when the final voltage step-up operation begins, and a timing circuit 39b for producing the timing signal t5 based on the delayed signal and the write enable signal $\overline{WE}$. The sense amplifier control circuit 38 generates a sense amplifier control signal $\phi$sa, for controlling the state of the sense amplifier 33 on the basis of the system control signal $\overline{SC}$, timing signal t5, automatic power down signal APD, and write enable signal $\overline{WE}$. The sense amplifier control circuit 38 is constituted as shown in FIG. 10. The bit-line and data-line load control circuit 36 outputs the bit-line load control signal $\phi$EQ, the bit-line variable impedance control signal LDO and data-line load control signal $\phi$DB. The circuit 36 is constituted as shown FIG. 11. The signals $\phi$EQ and $\phi$DB are produced under control of the timing signal t5 as an output of the voltage step-up detection circuit. The bit-line load control circuit 35 and the data-line load control circuit 32 may be conventionally constituted, an example of which is shown in FIG. 12.

Figure 13:
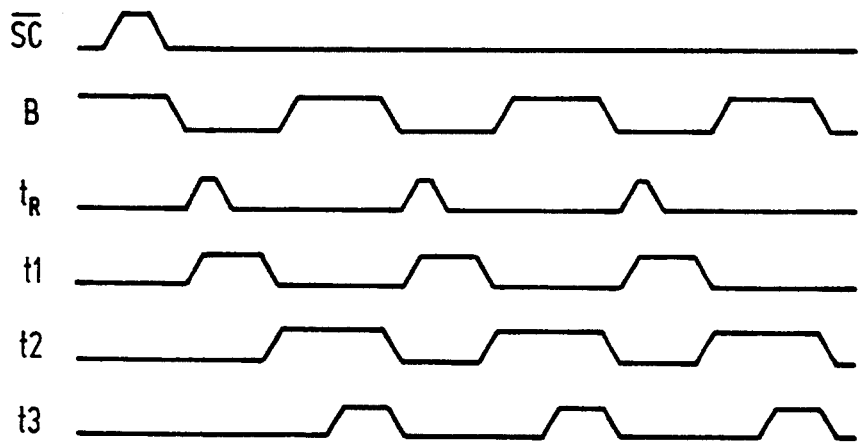
FIG. 13 is a timing chart showing signals in the ring-oscillator circuit and the deviation timing signal generating circuit of FIG. 3.

The writing operation of the present embodiment will now be described. During the writing operation, the write enable signal $\overline{WE}$ is set to be 'L' (low) and the automatic power down signal is also set to be 'L'. The internal timing circuit 31 outputs the system control signal $\overline{SC}$ with the value 'L' immediately before the writing operation begins, which causes the selective driving circuit 53 of FIG. 3 to output a logically high value for signal A. During the period wherein the output A is 'H', the ring oscillator 52 outputs oscillation pulses B as shown in FIG. 13. The appearance of the output B causes the transformer timing generation circuit 54 to generate timing signals $t_R$, t1, t2 and t3.

The timing signal $t_R$ is composed of a series of pulses which rise immediately after the respective oscillated pulses B drop and which have a pulse width narrower than that of the pulses B. The timing signal t1 is of a series of pulses which rise when the timing signal $t_R$ rises and which have a pulse width narrower than that of the pulses B and wider than that of the timing signal $t_R$. The timing signal t2 is of a series of pulses which change in their logical level inversely to the pulses of the timing signal t1. The remaining timing signal t3 is also of a series of pulses which go down to a logically low level in response to each low level transition of the timing signal t2 and which have a pulse width, i.e. an 'H' value duration, narrower than that of the signal t2.

The ring oscillator, or oscillation means, is provided in order that the stepped-up potential higher than the source potential is applied to the word lines repeatedly to thereby carry out the write and read operations of data to the memory cells 1 in a secure manner.

Figure 14:
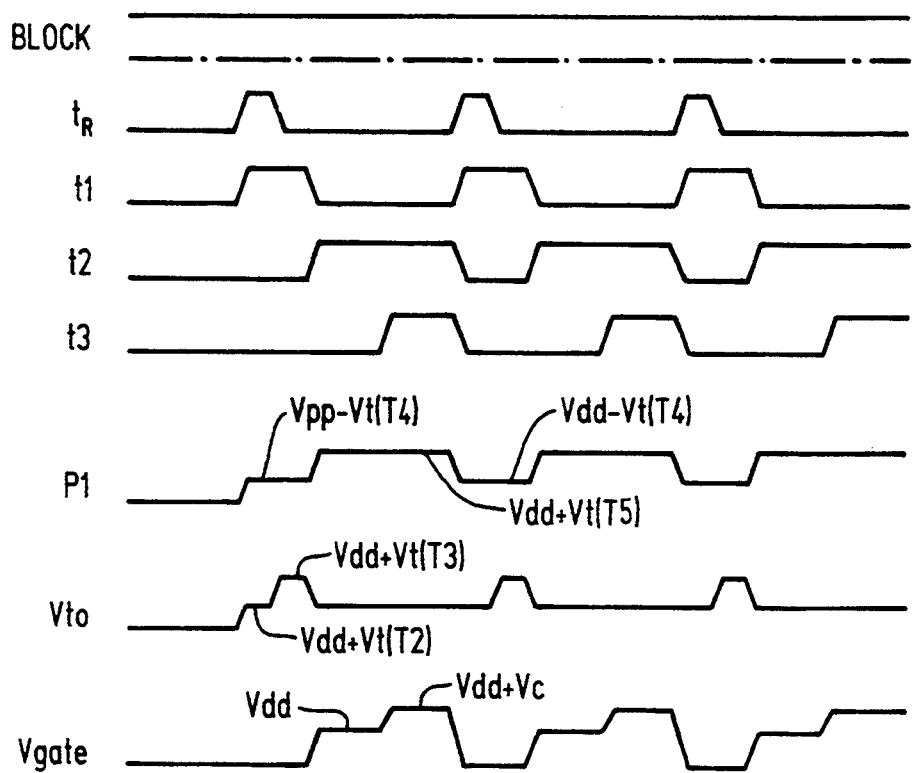
FIG. 14 is a timing chart showing signals in the step-up gate control signal generating circuit of FIG. 5.

FIG. 14 illustrates signals appearing in the step-up voltage gate control signal generating circuit 55 of FIG. 5. When a certain block (memory cell array) is in a selected condition, the block signal assigned to the selected block has the 'H' level. When the timing signals t2 and t3 are 'L', the change in the logical state of the timing signals $t_R$ and t1 from "L" to 'H' activates the MOS transistor T1 of the first voltage step-up gate control signal producing circuit 55a. Since the voltage step-up capacitors C1 and C2 are logically low at their negative poles, they are charged. During the charging operation, the potential of the voltage step-up gate control signal Vto is set to be (Vdd−Vt(T2)), and the node P1 is set to be {Vdd−Vt(T4)}, wherein Vt(T2) and Vt(T4) are threshold voltages (including a component of voltage drop due to back gate effect) of the MOS transistors T2 and T4, respectively. When the timing signal $t_R$ is changed in its state from logically high ('H') to low ('L') while the timing signal t1 remains logically high, the source voltage Vdd appears on the negative pole of the voltage step-up capacitor C1, so that the voltage of the voltage step-up gate control signal Vto is raised to the upper limit of (Vdd+Vt(T3)). The MOS transistor T3 is a part of the limitation circuit 55ac and functions to control the rise in voltage of the signal Vto as a positive potential of the voltage step-up capacitor C1.

When the timing signal t1 is changed from logically high to logically low and at the same time the signal t2 is changed from logically low to logically high, the voltage applying circuit 55bb causes the negative potential of the voltage step-up capacitor C2 to be logically high. Thus, the node P1 is set for its potential to be {Vdd+Vt(T5)}, wherein Vt(T5) is a threshold voltage of the transistor T5 including a voltage drop component due to back gate effect. The MOS transistor T5 is a part of the limitation circuit 55bc and controls the rise in potential of the node P1 in order to avoid destruction of transistor T6. The node potential is the positive potential of the capacitor C2. The gate potential of the MOS transistor T6 in the potential delivering circuit 55bd is {Vdd+Vt(T5)} and the drain potential thereof is Vdd. If the condition of Vt(T6)≦Vt(T5) is satisfied, the source potential thereof, that is the potential of the voltage step-up gate control signal Vgate, rises at least to the source potential Vdd, so that the capacitor C3 is charged. vt(T6) is a threshold voltage (including a voltage drop component due to the back gate effect) of the MOS transistor T6.

When the timing signal t3 is changed from logically low to logically high while the timing signal t2 remains logically high, the potential applying circuit 55be acts to raise the negative potential of the capacitor C3 to the source potential Vdd, which makes the potential of the voltage step-up gate control signal Vgate rise to the extent that it exceeds the source potential Vdd. Provided that the charging voltage of the capacitor C3 is represented by Vc3, the potential of the signal Vgate is expressed by {Vdd+Vc3}. The timing signals tR, t1 are then changed from logically low to logically high and the timing signals t2, t3 are changed from logically high to logically low. While the timing signal t1 is logically high, to thereby maintain the potential of the signal Vgate to be logically low, the discharging circuit 55bd is set to close and the MOS transistor T7 which is a part of the discharging circuit 55bf is activated.

Figure 15:
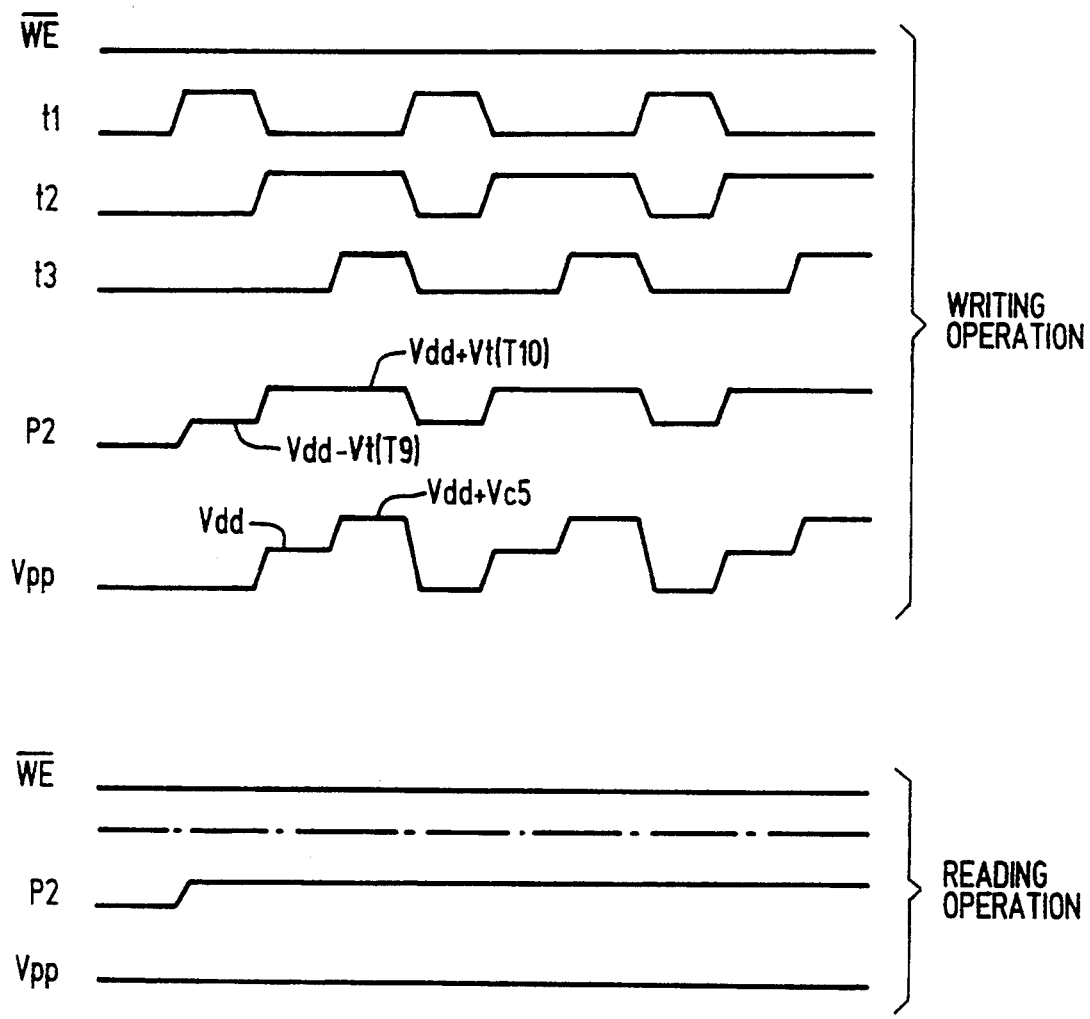
FIG. 15 is a timing chart showing signals in the stepped-up potential generating circuit of FIG. 6.

Referring now to FIG. 15, the operation of the stepped-up potential generating circuit 56 will be described. The writing operation is defined by the period wherein the write enable signal $\overline{WE}$ is maintained logically low. Firstly, when the timing signal t1 is changed from high to low* while the timing signals t2 and t3 are low, the MOS transistor T8 of the charge injection circuit 56a is activated to turn the MOS transistor T9 ON. Hence, the capacitor C4 is charged because the potential of the negative pole thereof is low. During this charging operation, the potential of the node P2 is set to be (Vdd−Vt(T9)} as shown in FIG. 15, wherein Vt(T9) is a threshold voltage (including a voltage drop component due to back gate effect) of the MOS transistor T9.

When the timing signal t1 becomes logically low and the timing signal t2 logically high, the potential applying circuit 56b acts to raise the negative potential of the capacitor C4 to reach the potential Vdd. Therefore, the potential of the node P2 rises to reach the upper limit of {Vdd+Vt(T10)}, where Vt(T10) is the threshold voltage of transistor T10. The MOS transistor T10 is a part of the limitation circuit 56bc and functions to control the potential rise of the node P2 so as not to destroy the MOS transistor T11. At the same time, the potential applying circuit 56e applies the source potential Vdd to the drain of the MOS transistor T11 of the potential delivering circuit. Since the gate potential of the MOS transistor T11 is {Vdd+Vt(T10)} and the drain potential thereof is Vdd, if the following formula is satisfied, the source potential thereof, that is the potential Vpp, is raised at least to the source potential Vdd and therefore the charging of the capacitor C5 is carried out.

$$Vt(T11) \leq Vt(T10)$$

wherein Vt(T11) is a threshold voltage (including a voltage drop component due to back gate effect) of the MOS transistor T11.

Next, when the timing signal t3 is changed to be logically high, the potential applying circuit 56f acts to raise the negative potential of the capacitor C5 to the source potential Vdd, and the potential Vpp rises to exceed the source potential Vdd. The stepped-up potential Vpp is expressed by {Vdd+Vc5}, wherein Vc5 represents the charged voltage of the capacitor C5. Thereafter, the timing signal t1 is changed to be logically high and the timing signals t2 and t3 are set to be logically low. The potential of the signal Vpp is maintained to be logically low during the logically low period of the timing signal.

Figure 16:
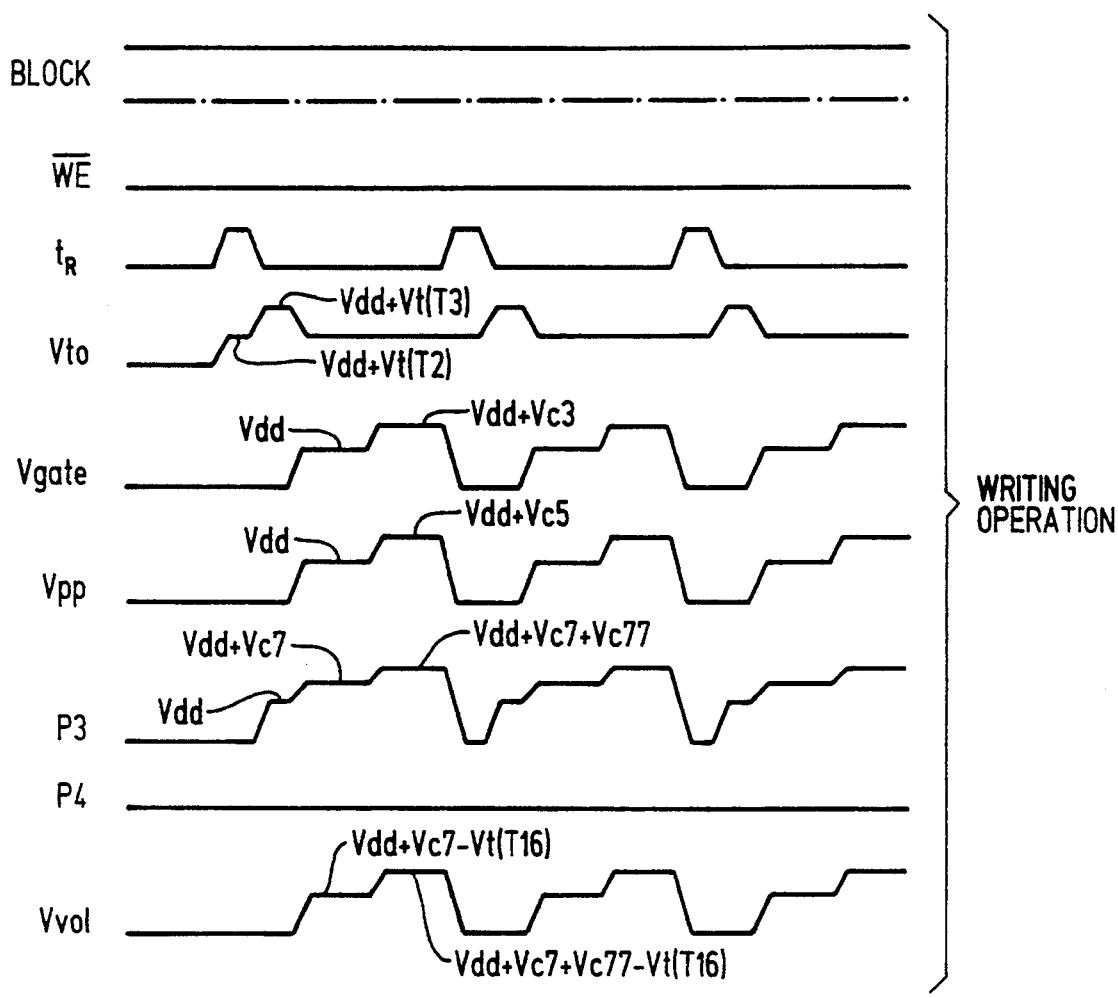
FIG. 16 is a timing chart showing signals in the word line supplied potential mixing circuit of FIG. 7.
Figure 16:
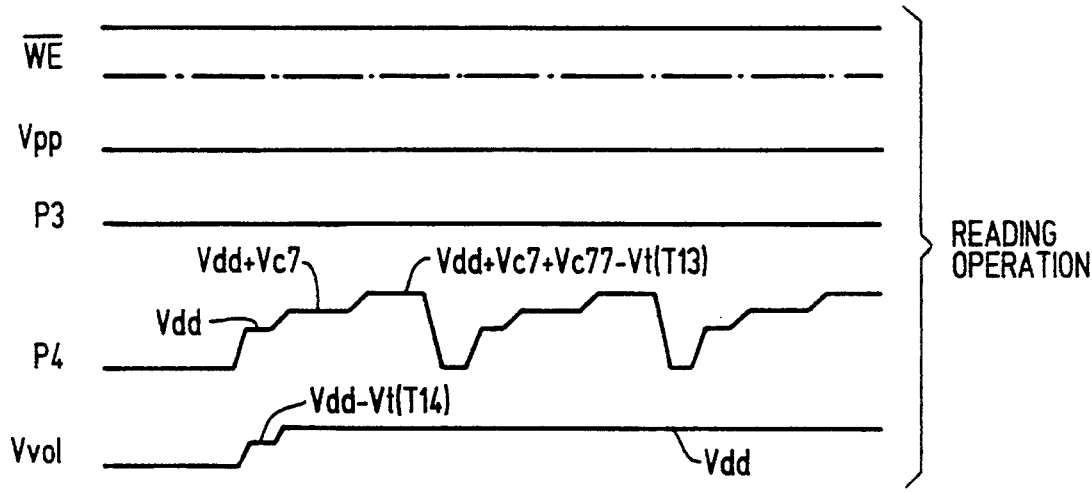

FIG. 16 illustrates the writing operation of the word-line potential synthesizing circuit 57. In the writing operation, the write enable signal $\overline{WE}$ is set to be logically low so that the source potential supplying circuit 57a is not activated to supply the source potential Vdd as the word-line supplying potential Vvol. When the timing signal tR is changed from logically high to logically low, the logic circuit 57ba acts to raise the drain potential of the MOS transistor T15 of the potential delivering circuit 57bb to the source potential Vdd, while the potential of the voltage step-up gate control signal Vto is elevated to {Vdd+Vt(T3)}. Hence, the potential of the node P3 is set to be {Vdd+Vt(T3)−Vt(T15)} (≈Vdd) so that charging of the capacitor C7 is carried out. Vt(T15) is a threshold voltage (including a voltage drop component due to back Gate effect) of the MOS transistor T15.

When the potential of the signal Vgate and the stepped-up potential Vpp are elevated to the source potential Vdd, the potential of the node P3 is set to exceed the source potential Vdd and to be (Vdd+Vc7}, wherein Vc7 represents the charging voltage of the capacitor C7. At this moment, the gate potential of the potential transfer circuit 57bc is {Vdd+Vc7} and the drain potential thereof is the stepped-up potential Vpp(=Vdd), so that the word-line supplying potential Vvol becomes {Vdd+Vc7−Vt(T16)}, wherein Vt(T16) is a threshold voltage (including a voltage drop component due to back gate effect) of the MOS transistor 16. Where Vc7 is set to be equal to or larger than Vt(T16), the word-line supplying voltage Vvol becomes Vdd. When the potential of the voltage step-up gate control signal Vgate becomes {Vdd+Vc3}, the gate potential of the potential delivering circuit 57bc becomes {Vdd+Vc7+Vc77} and therefore the word line supplying potential. Vvol is further elevated to become {Vdd+Vc7+Vc77−Vt(T16)}. Vc77 represents a potential increase by the second step-up operation. Accordingly, the word-line supplying potential Vvol is stepped up through a two-stage step-up operation so as to sufficiently exceed the source potential Vdd.

Figure 17:
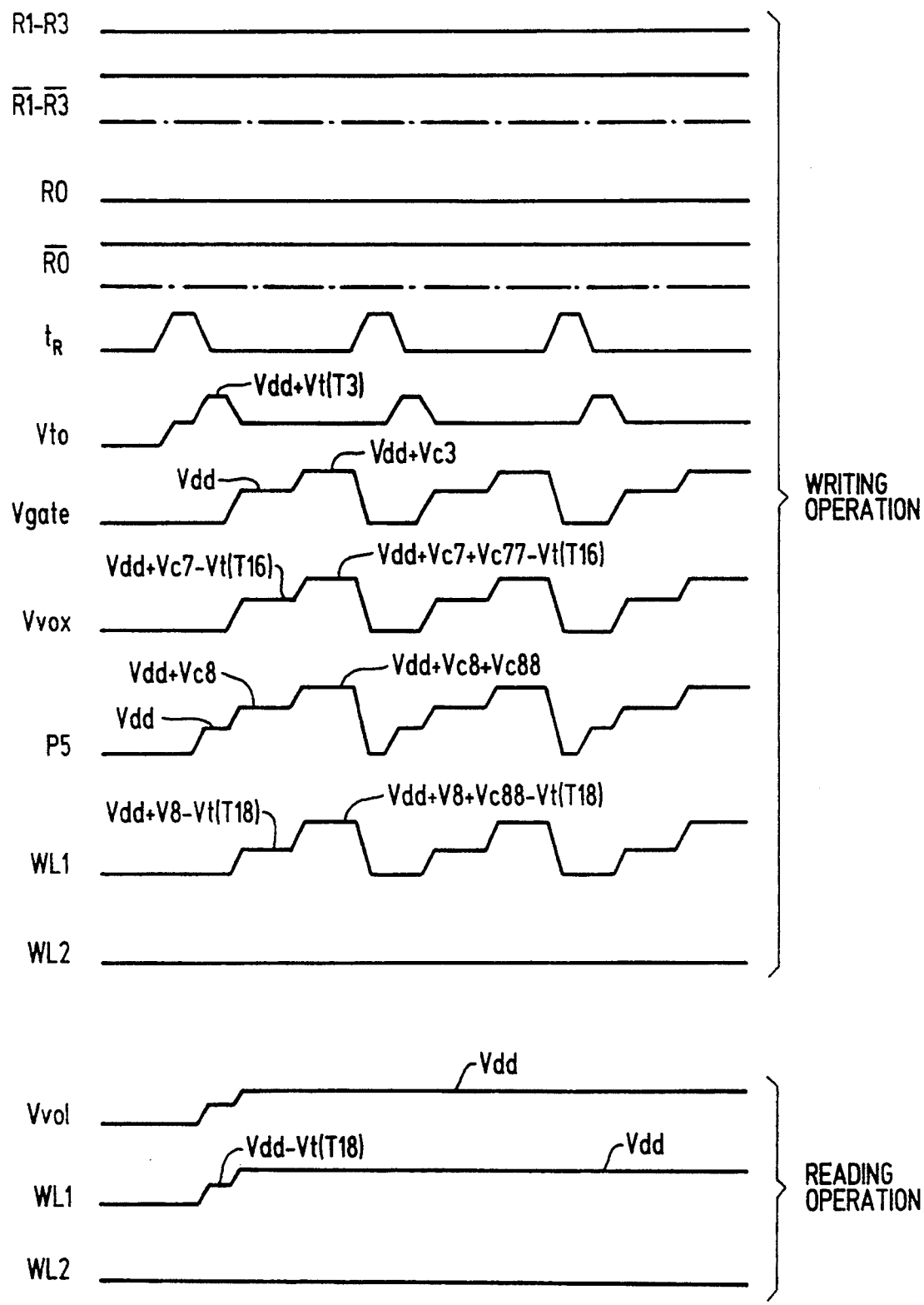
FIG. 17 is a timing chart showing signals in the word line potential supplying control circuit of FIG. 8.

FIG. 17 illustrates the writing operation of the word-line potential applying circuit. In the following, explanation will be made as to where the word line WL1 is selected. In response to the X-address buffer outputs R0–R3, $\overline{R0-R3}$, the X-address decoder and word-line buffer circuit 22a generate the source potential Vdd. The first potential delivering circuit 59a is activated while the word-line discharging circuit 59e is not activated. More specifically, when the potential of the voltage step-up control signal Vto becomes {Vdd+Vt(T3)}, the potential of the node P5, which is the source potential of the MOS transistor T17, is set to be {Vdd+Vt(T3)−Vt(T17)} (≈Vdd), by which the capacitor C8 is charged. Whereas, when the potential of the voltage step-up gate control signal Vgate becomes the source voltage Vdd, the node P5 potential is elevated to be {Vdd+Vc8}, wherein Vc8 represents the charged voltage of the capacitor C8. At this moment, the word-line supplying potential Vvol is {Vdd+Vc7−Vt(T16)}, and the potential applied to the word line WL1 is {Vdd+Vc8−Vt(T18)}. In addition, when the potential of the gate control signal Vgate becomes the source potential {Vdd+Vc3}, the node P5 potential is elevated to be as high as {Vdd+Vc8+Vc88}. Vc88 represents a potential increased by the second step up operation. Simultaneously, the word-line supplying potential Vvol is elevated to be {Vdd+Vc7+Vc77−Vt(T16)}. Therefore, the maximum potential applied to the word line WL1 becomes {Vdd+Vc8+Vc88−Vt(T18)}.

The following formula (5) can be obtained by substituting the source potential Vdd for the maximum potential Vmax in the above formula (3).

$$Vmax > Vt1 + Vt2 + VB \qquad (5).$$

Provided that Vt1 and Vt2 were set to be 0.9v while Vb was set to be 0.6v in view of the semiconductor manufacturing process, the writing word-line potential Vmax should be higher than 2.4 v. If the maximum potential Vmax is set to be $1.8V_{DD}$, the source potential Vdd should be higher than 1.33 v. The decrease in value of the source potential Vdd is beneficial for the battery source in terms of simplification thereof. According to the present invention, the data writing can be carried out even by using a power source composed of a single dry cell battery. Although the above formula (5) is established by the two-stage potential step-up, it can be satisfied by a single-stage potential step-up using a higher charging voltage. Where higher charging voltage is impossible or where it is desirable to assure a high stepped-up potential, a multiple-stage voltage step-up circuit may be utilized. The voltage step-up means may be a charge pump.

After the word line WL1 is supplied with the stepped-up potential, the timing signal $t_R$ is changed to be logically high and, in response, the discharge timing signal tRO is generated. During the period that the timing signal tRO is high, the voltage step-up capacitor discharge circuit 59d is being activated to cause the capacitor C8 to discharge and therefore the potential of the node P5 is maintained to be logically low.

The reading operation will now be explained. In reading, the ring oscillation circuit 51 is driven and the transformation timing signal producing circuit 54 generates the timing signals $t_R$, t1, t2 and t3 as shown in FIG. 13. In the step-up potential producing circuit 56, although the first stage of the charge injection circuit 56a is activated, the potential applying circuits 56b, 56e and 56f are not activated because the write enable signal $\overline{WE}$ is maintained logically high. Thus, the stepped-up potential Vpp remains logically low as shown in FIG. 15.

While, in the word-line potential synthesizing circuit 57, since the write enable signal $\overline{WE}$ is high and the stepped-up potential Vpp is low, the potential of the node P3 is fixed to be logically low as shown FIG. 16 and therefore the MOS transistor T16 is in a non-driven condition. When the write enable signal $\overline{WE}$ is high, the drain potential of the MOS transistor T12 is set to be the source potential Vdd, whereas when the voltage step-up gate control signal Vto becomes {Vdd+Vt(T3)}, the potential of the node P4 is set to be source potential Vdd and the charging of the capacitor C6 is carried out. Thereafter, when the potential of the voltage step-up gate control signal Vgate becomes the source potential Vdd, the potential of the node P4 is elevated to be (Vdd+Vc6), wherein Vc6 represents the charging voltage of the capacitor C6. Then, when the potential of the voltage step-up gate control signal Vgate becomes the source potential (Vdd+Vc3), the potential of the node P4 is elevated temporarily to be (Vdd+Vc6+Vc66). The node potential is then lowered to {Vdd+vt(T13)} under the control of the limitation circuit 57ad. Vt(T13) represents a threshold voltage (including a voltage drop component due to back gate effect) of the MOS transistor T13 and Vc66 represent the increase in potential obtained by the second step-up operation. The MOS transistor T14 is prevented from being destroyed by the limitation circuit 57ad. So long as the threshold voltage Vt(T14) is maintained to be equal to or less than Vt(T13), the word-line supplying potential Vvol, which is generated during data writing operation, is set to be equal to the source potential Vdd as shown in FIG. 16.

With reference to FIG. 17, the read operation of the word-line potential applying control circuit will be explained. In the following, the read operation wherein the word line WL1 is selected will be explained by way of example. In response to the X-address buffer outputs R0–R3, $\overline{R0}$–$\overline{R3}$, the X-decoder and word-line buffer 22a generates the source potential Vdd. The word-line discharging circuit 59e is not driven while the first potential delivering circuit 59a is driven. More specifically, when the potential of the control signal Vto becomes {Vdd+Vt(T3)}, the potential of the node P5 which is the source potential of the MOS transistor T17 is set to be {Vdd+Vt(T3)−Vt(T17)} (≈Vdd), and therefore the charging of the capacitor C8 is carried out. Next, when the potential of the signal Vgate becomes the source potential Vdd, the potential of the node P5 is elevated to be (Vdd+Vc8) and the word-line supplying potential Vvol is set to be Vdd. During the reading operation, a selected word line is supplied directly with the source potential Vdd.

In the present embodiment, multiple step-up operation is carried out by the ring oscillation circuit 51 during the writing operation, and writing of the same data into the same memory cell is performed several times. Therefore, even if the first writing of data into a memory cell is not carried out properly, the same data is securely written into the memory cell by the second or later writings. Hence, proper writing can be reliably obtained.

While there is a time lag between the point wherein the voltage step-up operation begins and that wherein the maximum stepped-up potential is obtained, this time lag introduces a period in which the word-line potential is temporarily low when the memory cells are activated. In other words, a transition period appears between the state wherein a word line is not selected and that wherein the word line is selected. As shown in FIG. 17, the transition period in the writing operation is such that the potential of the selected word line changes from 0v to (Vdd+Vc8)−Vt(T18), whereas that in the reading operation is such that the potential is changed from 0v to Vdd−Vt(T18).

Figure 18:
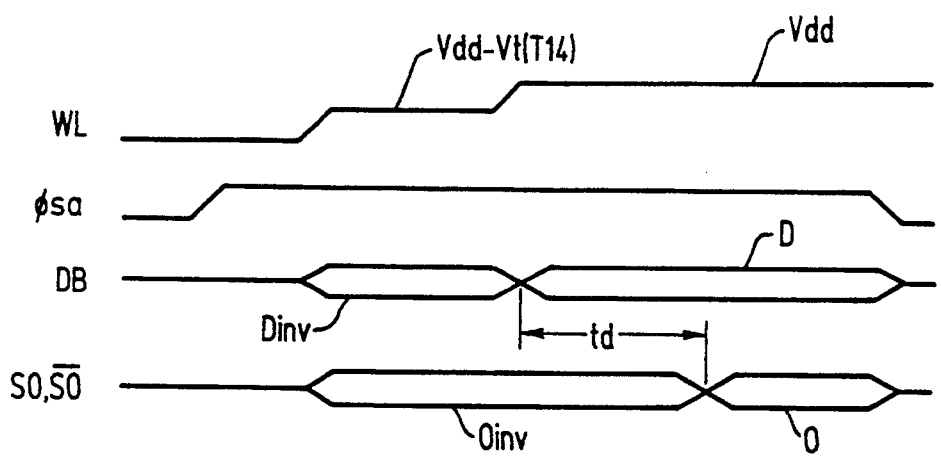
FIG. 18 is a timing chart showing signals in a portion of the circuit relating to reading operations and illustrating the inconvenience created by noise during reading in the device of FIG. 1.

In connection with the transition period in the reading operation, referring to FIG. 18, there will be described a generation of the sense amplification control signal φsa under the control of the internal synchronous circuit 31, which is carried out before the word-line potential is sufficiently elevated. When noise is induced during the step-up of the word-line potential, there is a possibility that the potential on the data line DB is adversely affected by such noise, which can cause the data D which is to be read on the data line DB to be an inverted data Dinv. If the inverted data Dinv is set on the data line instead of the original data D, the potential of the inverted data is amplified since the sense amplification circuit 33 has already been activated by application of the sense amplification control signal φsa. The sense amplifier 33 is set so that its output provides an inverted signal Dinv obtained by amplifying the potential of the inverted data Dinv. Thereafter, if the original data D appears on the data line, it needs a relatively large amount of time td before the proper output signal O which is obtained by amplifying the potential of the data D appears on the outputs SO and $\overline{SO}$ of the sense amplifier 33. In order to avoid such a time delay td, according to the present embodiment, the following circuit structure is adapted.

The present embodiment is provided with the voltage step-up detection circuit 39 which detects the completion of the step-up operation based on the timing signal t3 supplied from the word-line potential transformation circuit 50 and generates the detection signal $\overline{t5}$, and with the sense amplification control circuit 38 which activates the sense amplification circuit 33 according to the detection signal $\overline{t5}$ after completion of the step-up of the word lines. As is apparent from FIG. 14, the voltage step-up gate control signal Vgate is set to be at a maximum potential when the timing signal t3 is high. The stepped-up applying potential {Vdd+Vc8+Vc88−Vt(T18)} (FIG. 17) appears on the word line when the step-up gate control signal Vgate is set to be the maximum potential. In the reading operation, the word line is set to be the source potential Vdd before the timing signal t3 becomes high. Therefore, according to the present embodiment, the sense amplification control signal φsa is generated after the timing signal t3 changes from low to high in reading operations.

Figure 19:
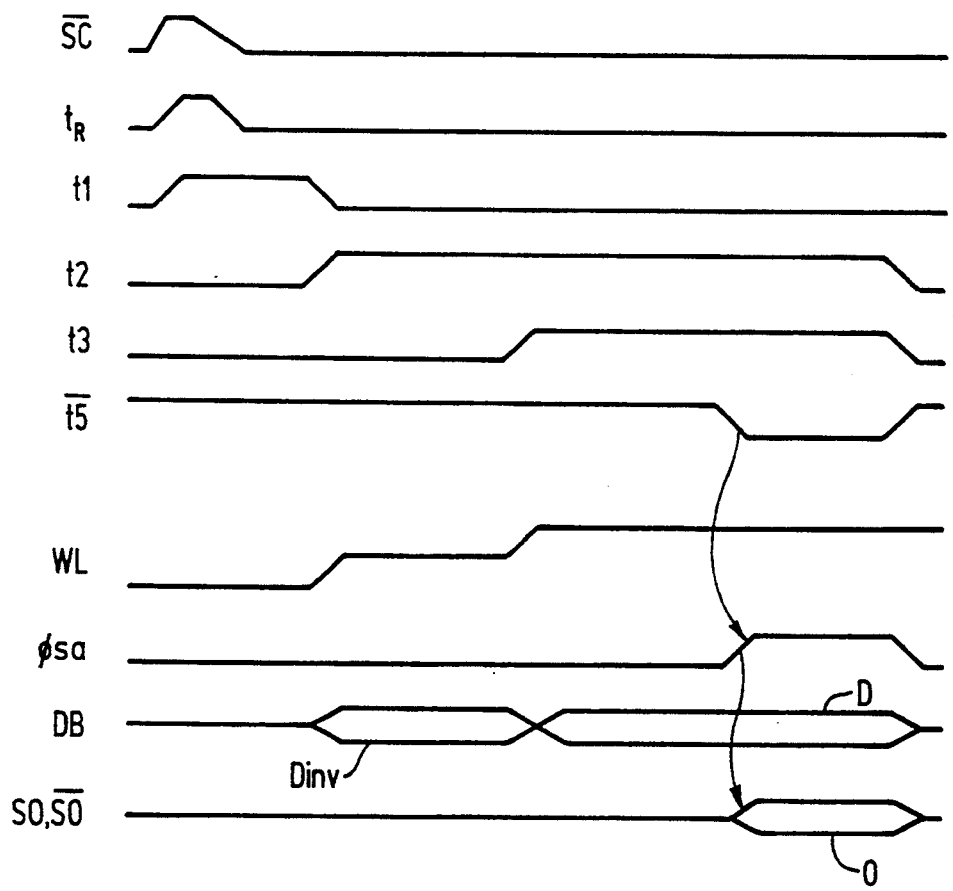
FIG. 19 is a timing chart showing signals in an improved portion of circuits relating to reading operations in the device of FIG. 1.

As shown in FIG. 19, the step-up detection circuit 39 generates the detection signal $\overline{t5}$ which drops in level a prescribed period of time after the timing signal t3 rises and rises at the same time that the timing signal t3 drops.

The sense amplifier control circuit 38 supplies the sense amplification control signal φsa to the sense amplifier circuit 33, wherein the signal φsa rises in level at the same time that the detection signal $\overline{t5}$ drops and drops at the same time that the signal $\overline{t5}$ rises. The sense amplifier circuit 33 is activated when it receives the signal φsa and amplifies the potential difference of the data line. As described above, since the sense amplifier circuit 33 is activated after completion of word-line step-up, the improper inverted data Dinv which is introduced by noise appearing on the data line will not be amplified. Therefore, the proper data D appearing on the data line is amplified via the sense amplifier circuit 33. The amplified voltage of the inverted data Dinv varies depending on the amount of induced noise and so the time required for compensating such erroneous data varies accordingly. In contrast, according to the present embodiment, such compensation time need not be provided. In the present embodiment, the control signal from the bit-line/data-line load control circuit 36 is also generated in accordance with the timing signal t5.

Figure 20:
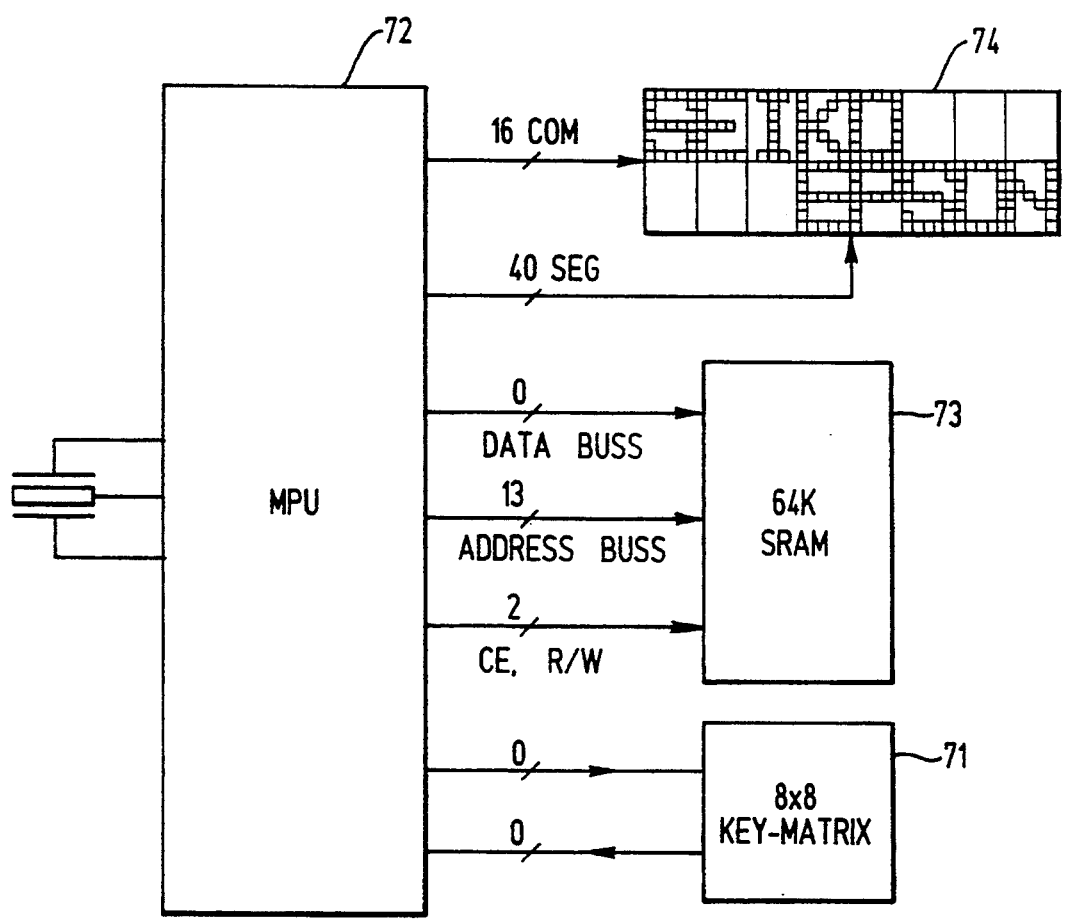
FIG. 20 is a block diagram showing the constitution of an electronic memo pad application including the device of FIG. 1.

The SRAM of FIG. 1 can be adapted for use in electronic devices such as a table calculator or the like, as shown in FIG. 20. This type of portable electronic device functions to store data such as date, time and the like which is input through a key matrix 71 into an SRAM 73 under the control of a microprocessor unit (MPU) 72 and displays data stored in the SRAM 73 on an LCD panel 74 in accordance with instructions input through the key matrix. This type of device must be of compact size and light weight and must have a long operating lifetime rather than a high processing speed.

Thus, it is preferable that this type of device be provided with the SRAM of FIG. 1 which is capable of being driven by a relatively low voltage so that such the device can be operated by a reduced number of dry cell batteries or a reduced capacity-type dry cell battery.

This application relates to subject matter disclosed in Japanese Application Numbers JP 14102/90, filed on Jan. 24, 1990; JP 17041/90, filed on Jan. 26, 1990; JP 14103/90, filed Jan. 24, 1990; JP 1704/90 filled Jan. 26, 1990; JP 159414/90 filed Jun. 8, 1990; JP 133226/90 filed May 23, 1990 and JP 2406/91 filed Jan. 14, 1991, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are thereforeto be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor memory device comprising:
   a bit line;
   at least one word line;
   means supplying a first source voltage and a second source voltage;
   a memory cell comprising: a flip-flop circuit which has a memory node, first load means, a first insulated gate field effect transistor connected between the first source voltage and the second source voltage, second load means, and a second insulated gate field effect transistor connected between the first source voltage and the second source voltage; and an additional insulated gate field effect transistor connected for accessing between the memory node of said flip-flop circuit and said bit line and for receiving the voltage on said word line as a gate input; and
   word line voltage transformation means connected and operative for applying a writing voltage to said word line and for controlling the writing voltage of said word line during data writing so that said writing voltage exceeds the first source voltage, wherein said word line voltage transformation means has a voltage transformation recurring means which conducts a potential stepping up and down operation repeatedly between a potential ranging from the source voltage and the potential of the writing voltage.

2. A semiconductor memory device according to claim 1 further comprising an applied potential detecting means which detects a point when the potential of the word line is set to be one for data reading operation, and a sense amplifier control means which generates a sense amplifier control signal for activating a sense amplifier means based on the output of the applied potential detecting means.

3. A semiconductor memory device according to claim 1 wherein said first and second load means are high resistance type load elements.

4. A semiconductor memory device according to claim 3 wherein said high resistance type load elements are of high resistance polysilicon.

5. A semiconductor memory device according to claim 3 wherein said high resistance type load elements are load type MOSs.

6. A semiconductor memory device comprising:
   a bit line;
   at least one word line;
   means supplying a first source voltage and a second source voltage;
   a memory cell comprising: a flip-flop circuit which has a memory node, first load means, a first insulated gate field effect transistor connected between the first source voltage and the second source voltage, second load means, and a second insulated gate field effect transistor connected between the first source voltage and the second source voltage; and an additional insulated gate field effect transistor connected for accessing between the memory node of said flip-flop circuit and said bit line and for receiving the voltage on said word line as a gate input; and
   word line voltage transformation means connected and operative for applying a writing voltage to said word line and for controlling the writing voltage of said word line during data writing so that said writing voltage exceeds the first source voltage, wherein said word line voltage transformation means has a voltage multi-step-up means which produces the writing voltage through at least two stages of step-up operations.

7. A semiconductor memory device comprising:
   a bit line;
   at least one word line;
   means supplying a first source voltage and a second source voltage;
   a memory cell comprising: a flip-flop circuit which has a memory node, first load means, a first insulated gate field effect transistor connected between the first source voltage and the second source voltage, second load means, and a second insulated gate field effect transistor connected between the first source voltage and the second source voltage; and an additional insulated gate field effect transistor connected for accessing between the memory node of said flip-flop circuit and said bit line and for receiving the voltage on said word line as a gate input; and
   word line voltage transformation means connected and operative for applying a writing voltage to said word line and for controlling the writing voltage of said word line during data writing so that said writing voltage exceeds the first source voltage, wherein said word line voltage transformation means comprises:
   oscillating means which generates recurring pulses during a writing operation;
   transformation timing signal generating means which generates timing signals based on the pulses generated by said oscillating means;
   step-up voltage generating means for generating a step-up voltage in response to a selected one of the timing signals, the value of the step-up voltage exceeding the first source voltage;
   step-up voltage gate control signal generating means for generating a step-up voltage gate control signal in response to a selected one of the timing signals, the voltage of the control signal exceeding the first source voltage;

word line supplying voltage synthesizing means which receives a potential from the step-up voltage from the step-up voltage generating means and a source potential from the first source voltage, and selectively outputs one of the received potentials as a word line supplying potential in accordance with the step-up voltage gate control signal; and word line potential applying control means operative to apply the word line supplying voltage to a word line to be selected, in accordance with a selected timing signal and the step-up voltage gate control signal.

8. A semiconductor memory device according to claim 7 wherein the oscillating means is a ring oscillating means.

9. A semiconductor memory device according to claim 8 wherein the ring oscillating means has a ring oscillator comprised of a plurality of logic circuits, and a selective driving means connected for activating the ring oscillator selectively in accordance with internal signals.

10. A semiconductor memory device according to claim 7 wherein said transformation timing signal generating means is composed of a plurality of logic circuits and a plurality of delay circuits.

11. A semiconductor memory device according to claim 7 wherein said step-up voltage generating means comprises: a first voltage step-up capacitor; a charging means which charges said first voltage step-up capacitor according to a selected one of the timing signals, and a first potential applying means for changing the value of the potential of said first capacitor in accordance with a selected one of the timing signals.

12. A semiconductor memory device according to claim 8 wherein said step-up voltage generating means comprises a second voltage step-up capacitor, and said charging means comprises:

a charge injection means which charges said second voltage step-up capacitor according to a selected one of the timing signals;

a potential applying means for changing the value of the potential of said second voltage step-up capacitor in accordance with a selected one of the timing signals;

a potential transfer means for receiving the stepped-up potential of the second voltage step-up capacitor as a control input in accordance with a preselected one of the timing signals; and a third potential applying means which applies a potential of either one of said first source voltage and said step-up voltage to said potential transfer means in accordance with a selected one of the timing signals.

13. A semiconductor memory device according to claim 7 wherein said step-up voltage generating means comprises a limiting means which limits an increase voltage by the voltage stepping-up operation.

14. A semiconductor memory device according to claim 7 wherein said step-up voltage gate control signal generating means has a first step-up voltage gate control signal generating circuit which generates a first step-up voltage control signal, and a second step-up voltage gate control signal generating circuit which generates a second step-up voltage gate control signal.

15. A semiconductor memory device according to claim 14 wherein said first step-up voltage control signal generating circuit has a charge injection means which charges a voltage step-up capacitor according to a selected one of the timing signals, and a potential applying means for changing the potential of the step-up capacitor in accordance with selected ones of the timing signals.

16. A semiconductor memory device according to claim 14 wherein said first step-up voltage gate control signal generating circuit has a limiting means which limits an increase in voltage by the voltage stepping-up operation.

17. A semiconductor memory device according to claim 14 wherein said second step-up voltage gate control signal generating circuit has a charging means which charges a first voltage step-up capacitor according to selected ones of the timing signals, and a first potential applying means for changing the potential of the first voltage step-up capacitor in accordance with selected ones of the timing signals.

18. A semiconductor memory device according to claim 17 wherein the charging means has:

a charge injection means which charges a second voltage step-up capacitor according to a selected one of the timing signals;

a second potential applying means for increasing a pole potential of the second voltage step-up capacitor in accordance with selected ones of the timing signals; and a potential transfer means for receiving a stepped-up potential from the second step-up voltage capacitor and sending out the received potential in accordance with selected ones of the timing signals.

19. A semiconductor memory device according to claim 7 wherein said word line supplying voltage synthesizing means has a source voltage supplying portion which supplies one potential of said source voltage to said word line potential applying control means when a data reading operation is selected, and a step-up voltage supplying portion which supplies the writing voltage to the word line potential applying control means when a writing operation is selected.

20. A semiconductor memory device according to claim 19 wherein:

said step-up voltage gate control signal generating means has a first step-up voltage gate control signal generating circuit which generates a first step-up voltage control signal, and a second step-up voltage gate control signal generating circuit which generates a second step-up voltage gate control signal; and said source voltage supplying portion has a first potential transfer means which is controlled by the first step-up voltage control signal based on internal signals, a voltage step-up capacitor which begins voltage stepping-up operation when it receives the second step-up voltage control signal, and a second potential transfer means for transferring one of said source voltages in accordance with the charged potential of said capacitor.

21. A semiconductor memory device according to claim 20 wherein the source voltage supplying portion has a limiting means which limits an increase in voltage by the voltage stepping-up operation.

22. A semiconductor memory device according to claim 19 wherein said step-up voltage supplying portion comprises:

a first potential transfer means which is controlled by the first step-up voltage gate control signal on the basis of internal signals and a selected one of the timing signals, and a voltage step-up capacitor which begins a voltage step-up operation when it receives the second step-up voltage gate control signal; and a second potential transfer means for transferring the step-up voltage in accordance with the charged potential of said voltage step-up capacitor.

23. A semiconductor memory device according to claim 19 wherein said source voltage supplying portion has a limiting means which limits an increase in voltage by a voltage stepping-up operation.

24. A semiconductor memory device according to claim 11 wherein said word line potential applying control means has a first potential transfer means which transfers a selected potential of a word line buffer means and line decoder, under control of the second voltage step-up control signal, a step-up capacitor which begins a voltage stepping-up operation, and a second potential transfer means which supplies the word line supplying voltage to the word line under control of the step-up voltage.

25. A semiconductor memory device according to claim 24 wherein the word line potential applying control means has a discharge timing means which generates a discharge timing signal when it receives internal signals and selected ones of the timing signals, and a discharging means which discharges the voltage step-up capacitor according to the discharge timing signal.

26. A semiconductor memory device according to claim 24 wherein the word line potential applying control means has a word line discharging means which discharges the charge of the word line in accordance with a potential representing a non-selected condition by the word line buffer means with line decoder.

27. A semiconductor memory device according to claim 7 wherein:

said step-up voltage generating means comprises: a first voltage step-up capacitor; a charging means which charges said first voltage step-up capacitor according to a selected one of the timing signals, and a first potential applying means for changing the value of the potential of said first capacitor in accordance with a selected one of the timing signals;

said device further comprises a first semiconductor layer, an insulating layer formed on said first semiconductor layer, and a second semiconductor layer disposed on said insulating layer; and said step-up capacitor has two electrodes, one electrode of said step-up capacitor is formed in said first semiconductor layer and the other electrode of said step-up capacitor is formed in said second semiconductor layer.

28. A semiconductor memory device according to claim 27 wherein said electrodes of said step-up capacitor include a negative electrode and a positive electrode, said negative electrode is formed in said second semiconductor layer, and said positive electrode of said step-up capacitor is formed in said first semiconductor layer.

29. A semiconductor memory device comprising:
a plurality of bit lines;
at least one word line;
means supplying a first source potential and a second source potential, the first and second source potentials having respectively different values;

a memory cell comprising: a flip-flop circuit which has memory nodes, a first insulated gate field effect transistor with first serial connected load means connected between a point at the first source voltage and a point at the second source voltage, and a second insulated gate field effect transistor with second serial connected load means connected between a point at the first source potential and a point at the second source potential; and a plurality of additional insulated gate field effect transistors connected for accessing between memory nodes of said flip-flop circuit and said bit lines and for receiving the potential on said word line as a gate input; and word line voltage transformation means connected and operative for applying a writing potential to said word line and for controlling the writing potential of said word line during data writing so that said potential exceeds the first and second source potentials, wherein said word line voltage transformation means has a voltage transformation recurring means which conducts a potential stepping up and down operation repeatedly between a potential ranging from the source voltage and the potential of the writing voltage.

30. A semiconductor memory device according to claim 29 wherein the first source potential has a higher voltage value than the second source potential.

31. A semiconductor memory device according to claim 30 wherein said word line voltage transformation means has a step-up voltage generating means which generates a step-up voltage that is higher than the first source potential when a data writing operation is selected, and a potential applying control means for applying the step-up voltage to the word line when the writing operation is selected and for applying the first potential to the word line when a data reading operation is selected.

32. A semiconductor memory device according to claim 30 further comprising an applied potential detecting means which detects a point when the potential of the word line is set to be one for data reading operation, and a sense amplifier control means which generates a sense amplifier control signal for activating a sense amplifier means based on the output of the applied potential detecting means.

33. A data processing device comprising:
a logical operation means which performs logic operation on data;
an input/output means which effects input or output of the data; and
memory means for storing data, wherein said memory means comprise:
a plurality of bit lines;
at least one word line;
means supplying a source voltage;
a memory cell comprising: a flip-flop circuit which has memory nodes, first load means, a first insulated gate field effect transistor connected between the source voltage, second load means, and a second insulated gate field effect transistor connected between the source voltage; and a plurality of additional insulated gate field effect transistors connected for accessing between memory nodes of said flip-flop circuit and said bit lines and for receiving the potential on said word line as a gate input; and word line voltage transformation means connected and operative for applying a writing voltage to said word line and for controlling the writing voltage of said word line during data writing so that said writing voltage exceeds the source voltage, wherein said word line voltage transformation means has a voltage transformation recurring means which conducts a potential stepping up and down operation repeatedly between a potential ranging from the source voltage and the potential of the writing voltage.

34. A data processing device according to claim 33 wherein said word line voltage transformation means has a voltage transformation recurring means which conducts a potential stepping up and down operation repeatedly between a potential ranging between the source voltage and the writing potential of the writing voltage.

35. A data processing device according to claim 33 wherein said word line voltage transformation means has a voltage multi-step-up means which produces the writing voltage through at least two stages of step-up operations.

36. A data processing device according to claim 33 further comprising an applied potential detecting means which detects a point when the potential of the word line is set to be one for a data reading operation, and a sense amplifier control means which generates a sense amplifier control signal for activating a sense amplifier means based on the output of the applied potential detecting means.

* * * * *